(12) United States Patent
Matsumura et al.

(10) Patent No.: US 9,882,137 B2
(45) Date of Patent: Jan. 30, 2018

(54) ORGANIC SEMICONDUCTOR COMPOSITION, ORGANIC THIN FILM TRANSISTOR, ELECTRONIC PAPER, AND DISPLAY DEVICE

(71) Applicant: FUJIFILM CORPORATION, Tokyo (JP)

(72) Inventors: Tokihiko Matsumura, Kanagawa (JP); Yasuaki Matsushita, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/450,240

(22) Filed: Mar. 6, 2017

(65) Prior Publication Data
US 2017/0179387 A1 Jun. 22, 2017

Related U.S. Application Data

(63) Continuation of application No. PCT/JP2015/076826, filed on Sep. 24, 2015.

(30) Foreign Application Priority Data

Sep. 30, 2014 (JP) ................................. 2014-201428

(51) Int. Cl.
| | | |
|---|---|---|
| H01L 51/00 | (2006.01) | |
| H01L 51/05 | (2006.01) | |
| H01L 51/10 | (2006.01) | |

(52) U.S. Cl.
CPC ........ *H01L 51/005* (2013.01); *H01L 51/0036* (2013.01); *H01L 51/0043* (2013.01);
(Continued)

(58) Field of Classification Search
CPC ............... H01L 51/005; H01L 51/0036; H01L 51/0043; H01L 51/0094; H01L 51/0055;
(Continued)

(56) References Cited

U.S. PATENT DOCUMENTS

2016/0064674 A1* 3/2016 Matsushita ......... H01L 51/0035
257/40
2016/0071624 A1* 3/2016 Matsushita ........... C08F 212/14
252/500
(Continued)

FOREIGN PATENT DOCUMENTS

| | | |
|---|---|---|
| JP | 2004-088094 A | 3/2004 |
| JP | 2005-005582 A | 1/2005 |
| WO | 2013/072853 A1 | 5/2013 |

OTHER PUBLICATIONS

Extended European Search Report issued by the European Patent Office dated Aug. 17, 2017, which corresponds to EP15846659.9-1552 and is related to U.S. Appl. No. 15/450,240.
(Continued)

*Primary Examiner* — Nicholas Tobergte
(74) *Attorney, Agent, or Firm* — Studebaker & Brackett PC

(57) ABSTRACT

The present invention provides an organic semiconductor composition which makes it possible to prepare an organic thin film transistor having excellent insulation reliability while inhibiting the deterioration of mobility, and to provide an organic thin film transistor prepared using the composition. Furthermore, the present invention provides electronic paper and a display device which contain the organic thin film transistor. The organic semiconductor composition according to the present invention contains an organic semiconductor material and at least one kind of migration inhibitor selected from a compound represented by the following Formula (I), a compound represented by the following Formula (II), and a compound represented by the following Formula (III).

(I)

(Continued)

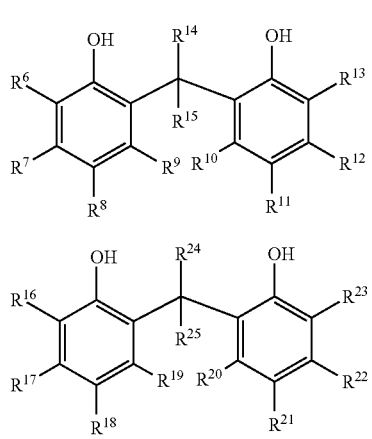

(II)

(III)

20 Claims, 1 Drawing Sheet

(52) U.S. Cl.
CPC ...... *H01L 51/0094* (2013.01); *H01L 51/0055* (2013.01); *H01L 51/0074* (2013.01); *H01L 51/055* (2013.01); *H01L 51/0541* (2013.01); *H01L 51/0545* (2013.01); *H01L 51/0566* (2013.01); *H01L 51/105* (2013.01)

(58) Field of Classification Search
CPC ............. H01L 51/0074; H01L 51/0541; H01L 51/0545; H01L 51/055; H01L 51/0566; H01L 51/105
See application file for complete search history.

(56) References Cited

U.S. PATENT DOCUMENTS

2016/0087208 A1\* 3/2016 Matsushita ............. C08L 33/14
  524/516
2016/0230033 A1\* 8/2016 Matsushita ............. C09D 5/24

OTHER PUBLICATIONS

International Search Report issued in PCT/JP2015/076826; dated Dec. 1, 2015.
Written Opinion issued in PCT/JP2015/076826; dated Dec. 1, 2015.
International Preliminary Report on Patentability issued in PCT/JP2015/076826, dated Apr. 13, 2017.

\* cited by examiner

ORGANIC SEMICONDUCTOR COMPOSITION, ORGANIC THIN FILM TRANSISTOR, ELECTRONIC PAPER, AND DISPLAY DEVICE

CROSS-REFERENCE TO RELATED APPLICATIONS

This application is a Continuation of PCT International Application No. PCT/JP2015/076826 filed on Sep. 24, 2015, which claims priority under 35 U.S.C. §119(a) to Japanese Patent Application No. 2014-201428 filed on Sep. 30, 2014. The above application is hereby expressly incorporated by reference, in its entirety, into the present application.

BACKGROUND OF THE INVENTION

1. Field of the Invention

The present invention relates to an organic semiconductor composition, an organic thin film transistor, electronic paper, and a display device.

2. Description of the Related Art

In the related art, organic semiconductor devices having an organic semiconductor film (organic semiconductor layer) consisting of an organic semiconductor material are widely known. The organic semiconductor devices are used in various apparatuses. Particularly, the organic semiconductor device are adopted in a thin film transistor (TFT) used in a liquid crystal display or an organic EL display, an apparatus using a logic circuit such as an RF tag (RFID, Radio Frequency identifier) or a memory, and the like, because the use of the organic semiconductor devices makes it possible to achieve weight lightening and cost reduction and to impart properties such as excellent flexibility.

An expectation for an organic thin film transistor among the organic semiconductor devices is increasing, and various techniques are being suggested.

For example, JP2004-88094A discloses the formation of an organic semiconductor layer for an organic thin film transistor by using a composition containing an organic functional material, a solvent, and an antioxidant. JP2004-88094A discloses, as the antioxidant contained in the composition, for example, 2,6-di-t-butyl-4-ethylphenol. According to the composition of JP2004-88094A, it is possible to inhibit the change of physical properties caused by oxygen or the precipitation of solutes.

JP2005-5582A discloses an organic thin film transistor in which an organic semiconductor layer is formed of a composition containing an antioxidant so as to reduce the oxidation and deterioration of the organic semiconductor layer. More specifically, in examples of JP2005-5582A, as the antioxidant, a hindered phenol-based antioxidant (manufactured by NAGASE & CO., LTD., trade name "IRGANOX 1076"), 2,2'-methylenebis(6-tert-butyl-p-cresol) (manufactured by Sumitomo Chemical Co., Ltd., trade name "SUMILIZER MDP-S"), or the like is used.

SUMMARY OF THE INVENTION

Meanwhile, in recent years, a further improvement of the performance of organic semiconductor devices has been required, and a technique has been required which further improves the inter-electrode insulation reliability while inhibiting the deterioration of mobility. Particularly, because electronic parts are being required to become compact and highly integrated and demonstrate high performance, metal wiring is being increasingly miniaturized. Therefore, due to the occurrence of electromigration (hereinafter, simply referred to as "migration" as well), the wiring reliability (that is, the inter-electrode insulation reliability) markedly deteriorates easily.

Under these circumstances, organic thin film transistors were prepared using the compositions containing the antioxidant disclosed in JP2004-88094A or JP2005-5582A. As a result, it was revealed that the mobility or the inter-electrode insulation reliability of the organic thin film transistors are insufficient.

One of the objects according to some aspects of the present invention is to provide an organic semiconductor composition which makes it possible to prepare an organic thin film transistor having excellent insulation reliability while inhibiting the deterioration of mobility, and to provide an organic thin film transistor prepared using the composition. Furthermore, one of the objects according to some aspects of the present invention is to provide electronic paper and a display device which contain the organic thin film transistor.

Regarding the aforementioned objects, the inventors of the present invention conducted intensive investigation. As a result, they found that the objects can be achieved by using a specific migration inhibitor, and accomplished the present invention.

That is, the inventors of the present invention found that the objects can be achieved by the following constitution.

[1] An organic semiconductor composition comprising an organic semiconductor material and at least one kind of migration inhibitor selected from a compound represented by Formula (I) which will be described later, a compound represented by Formula (II) which will be described later, and a compound represented by Formula (III) which will be described later.

In Formula (I) which will be described later, $R^1$ to $R^5$ each independently represent a hydrogen atom or a substituent. Here, at least one of $R^1$ or $R^5$ is —OH, —OR$^{26}$, —SR$^{27}$, —NHCOR$^{28}$, or —NHSO$_2$R$^{29}$, or $R^3$ is —SR$^{27}$, —NHCOR$^{28}$, or —NHSO$_2$R$^{29}$. $R^{26}$ to $R^{29}$ each independently represent an alkyl group or an aryl group.

In Formula (II) which will be described later, $R^6$ to $R^{13}$ represent a hydrogen atom or a substituent. Here, at least one of $R^6$, $R^7$, $R^8$, $R^9$, $R^{10}$, $R^{11}$, $R^{12}$, or $R^{13}$ is —OH, —OR$^{26}$, —SR$^{27}$, —NHCOR$^{28}$, or —NHSO$_2$R$^{29}$. $R^{26}$ to $R^{29}$ each independently represent an alkyl group or an aryl group. $R^{14}$ and $R^{15}$ each independently represent a hydrogen atom, an aliphatic group, an aromatic group, a heterocyclic group, —OH, —OR$^{30}$, —SR$^{31}$, or —NR$^{32}$R$^{33}$. $R^{30}$ to $R^{33}$ each independently represent an alkyl group or an aryl group. Here, there is no case where both of $R^{14}$ and $R^{15}$ simultaneously represent a group selected from —OH, —OR$^{30}$, —SR$^{31}$, and —NR$^{32}$R$^{33}$. $R^{14}$ and $R^{15}$ may form a ring by being bonded to each other.

In Formula (III) which will be described later, $R^{16}$ to $R^{23}$ each independently represent a hydrogen atom, an aliphatic group, or an aromatic group. $R^{24}$ and $R^{25}$ each independently represent a hydrogen atom, an aliphatic group, an aromatic group, or a heterocyclic group. Here, there is no case where both of $R^{24}$ and $R^{25}$ simultaneously represent a hydrogen atom. $R^{24}$ and $R^{25}$ may form a ring by being bonded to each other.

[2] An organic semiconductor composition comprising an organic semiconductor material and at least one kind of migration inhibitor selected from a compound represented by Formula (IV) which will be described later, a compound represented by Formula (II) which will be described later, and a compound represented by Formula (III) which will be described later, in which a content of the migration inhibitor is equal to or greater than 30% by mass and equal to or less than 500% by mass with respect to 100% by mass of the organic semiconductor material.

In Formula (IV) which will be described later, $R^{1A}$ to $R^{5A}$ each independently represent a hydrogen atom or a substituent. Here, at least one of $R^{1A}$, $R^{2A}$, $R^{3A}$, $R^{4A}$, or $R^{5A}$ is —OH, —$OR^{26}$, —$SR^{27}$, —$NHCOR^{28}$, or —$NHSO_2R^{29}$. $R^{26}$ to $R^{29}$ each independently represent an alkyl group or an aryl group.

In Formula (II) which will be described later, $R^6$ to $R^{13}$ represent a hydrogen atom or a substituent. Here, at least one of $R^6$, $R^7$, $R^8$, $R^9$, $R^{10}$, $R^{11}$, $R^{12}$, or $R^{13}$ is —OH, —$OR^{26}$, —$SR^{27}$, —$NHCOR^{28}$, or —$NHSO_2R^{29}$. $R^{26}$ to $R^{29}$ each independently represent an alkyl group or an aryl group. $R^{14}$ and $R^{15}$ each independently represent a hydrogen atom, an aliphatic group, an aromatic group, a heterocyclic group, —OH, —$OR^{30}$, —$SR^{31}$, or —$NR^{32}R^{33}$. $R^{30}$ to $R^{33}$ each independently represent an alkyl group or an aryl group. Here, there is no case where both of $R^{14}$ and $R^{15}$ simultaneously represent a group selected from —OH, —$OR^{30}$, —$SR^{31}$, and —$NR^{32}R^{33}$. $R^{14}$ and $R^{15}$ may form a ring by being bonded to each other.

In Formula (III) which will be described later, $R^{16}$ to $R^{23}$ each independently represent a hydrogen atom, an aliphatic group, or an aromatic group. $R^{24}$ and $R^{25}$ each independently represent a hydrogen atom, an aliphatic group, an aromatic group, or a heterocyclic group. Here, there is no case where both of $R^{24}$ and $R^{25}$ simultaneously represent a hydrogen atom. $R^{24}$ and $R^{25}$ may form a ring by being bonded to each other.

[3] The organic semiconductor composition according to [1] or [2], in which a chemical structure of the organic semiconductor material does not have a repeating unit.

[4] An organic thin film transistor comprising an organic semiconductor layer prepared using the organic semiconductor composition according to any one of [1] to [3].

[5] The organic thin film transistor according to [4], further comprising a source electrode, a drain electrode, and a gate electrode, in which at least one of the source electrode, the drain electrode, and the gate electrode is made of a silver-containing material.

[6] Electronic paper comprising the organic thin film transistor according to [4] or [5].

[7] A display device comprising the organic thin film transistor according to [4] or [5].

According to the present invention, it is possible to provide an organic semiconductor composition which makes it possible to prepare an organic thin film transistor having excellent insulation reliability while inhibiting the deterioration of mobility, and to provide an organic thin film transistor prepared using the composition. Furthermore, according to the present invention, it is possible to provide electronic paper and a display device which contain the organic thin film transistor.

DESCRIPTION OF THE PREFERRED EMBODIMENTS

Figure 1:
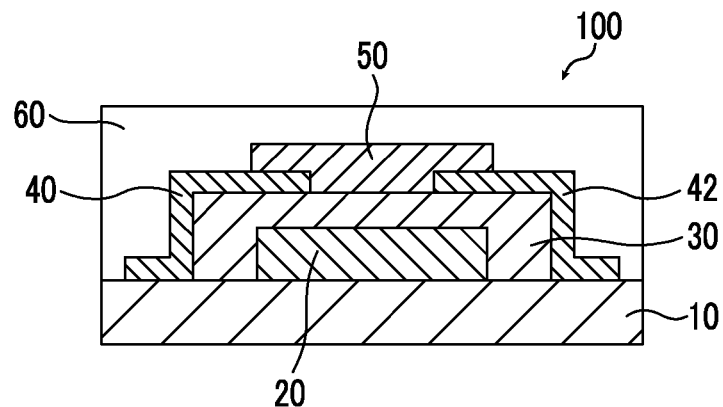
FIG. 1 is a schematic cross-sectional view of a bottom contact-type organic thin film transistor according to an embodiment of the present invention.

Hereinafter, suitable embodiments of the present invention will be described. The embodiments described below explain an example of the present invention. The present invention is not limited to the following embodiments and include various modification examples embodied within a scope that does not change the gist of the present invention.

In the present specification, in a case where there is no description regarding whether a group (atomic group) is substituted or unsubstituted, the group includes both of a group not having a substituent and a group having a substituent. For example, an "alkyl group" includes not only an alkyl group not having a substituent (unsubstituted alkyl group) but also an alkyl group having a substituent (substituted alkyl group).

In the present specification, a range of numerical values described using "to" means a range which includes the numerical values listed before and after "to" as a lower limit and an upper limit.

1. First Embodiment 1. 1. Organic Semiconductor Composition

An organic semiconductor composition according to an embodiment of the present invention contains an organic semiconductor material and at least one kind of migration inhibitor selected from a compound represented by the following Formula (I), a compound represented by the following Formula (II), and a compound represented by the following Formula (III).

Hereinafter, the components contained in the organic semiconductor composition of the present embodiment and the components which can be contained in the composition will be specifically described.

1. 1. 1. Organic Semiconductor Material

The organic semiconductor composition according to the present embodiment contains an organic semiconductor material. The organic semiconductor material is a material that exhibits the properties of a semiconductor.

As the organic semiconductor material, any of known materials used for forming an organic semiconductor layer of an organic transistor may be used. The organic semiconductor material can be classified into, for example, an organic semiconductor material not having a repeating unit in the chemical structure (hereinafter, referred to as a "low-molecular weight organic semiconductor material" as well) and an organic semiconductor material having a repeating unit in the chemical structure (hereinafter, referred to as a "high-molecular weight organic semiconductor" as well).

Not having a repeating unit means that the compound does not have a plurality of specific repeating structures (structures derived from polymerizable compound (polymer)).

Examples of the low-molecular weight organic semiconductor material include pentacenes such as 6,13-bis(triisopropylsilylethynyl)pentacene (TIPS pentacene), tetramethylpentacene, and perfluoropentacene, anthradithiophenes such as 5,11-bis(triethylsilylethynyl)anthradithiophene (TES-ADT) and 2,8-difluoro-5,11-bis(triethylsilylethynyl)anthradithiophene (diF-TES-ADT), benzothienobenzothiophenes such as diphenylbenzothienobenzothiophene (DPh-BTBT) and alkylbenzothienobenzothiophene (Cn-BTBT), dinaphthothienothiophenes such as alkyldinaphthothienothiophene (Cn-DNTT), dioxaanthanthrenes such as perixanthenoxanthene, rubrenes, fullerenes such as C60 and phenyl $C_{61}$ butyric acid methyl ester (PCBM), phthalocyanines such as copper phthalocyanine and fluorinated copper phthalocyanine, and the like.

The molecular weight of the low-molecular weight organic semiconductor material is not particularly limited, but is, for example, equal to or less than 2,000.

Examples of the high-molecular weight organic semiconductor material include polythiophenes such as poly(3-hexylthiophene) (P3RT), polyquaterthiophene (PQT), and poly(3-hexylthiophene) (P3HT), polythienothiophenes such as poly[2,5-bis(3-dodecylthiophen-2-yl)thieno[3,2-b]thiophene] (PBTTT), and the like.

The number-average molecular weight of the high-molecular weight organic semiconductor material is not particularly limited, but is, for example, greater than 2,000.

In the present invention, a weight-average molecular weight and a number-average molecular weight are measured under the following conditions by using gel permeation chromatography (GPC).

Device: HLC-8320 GPC manufactured by Tosoh Corporation

Column: TSK-GEL G3000PWXL manufactured by Tosoh Corporation

Column temperature: 35° C.

Flow rate: 0.5 mL/min

Calibration curve: POLY SODIUM ACRYLATE STANDARD manufactured by SOWA SCIENCE CORPORATION Eluant: solution obtained by diluting mixture of sodium dihydrogen phosphate dodecahydrate/sodium dihydrogen phosphate dihydrate (34.5 g/46.2 g) with 5,000 g of pure water.

If voltage is applied in a state where the organic semiconductor layer has absorbed moisture, metal ions are easily generated from an electrode, and the migration easily markedly occurs. Particularly, an organic semiconductor layer formed using a low-molecular weight organic semiconductor material among the aforementioned organic semiconductor materials has hygroscopicity higher than that of an organic semiconductor layer formed using a high-molecular weight organic semiconductor material. If the organic semiconductor composition according to the present embodiment is used as a solution to the above problem, even in a case where the composition contains a high-molecular weight organic semiconductor material having high hygroscopicity, due to the action of a specific migration inhibitor which will be described later, the occurrence of migration can be sufficiently inhibited. Therefore, a low-molecular weight organic semiconductor material can be preferably used because then the effects of the present invention are markedly exhibited.

The content of the organic semiconductor material is not particularly limited as long as the organic semiconductor layer which will be described later can be formed. From the viewpoint of facilitating handling, for example, the content is preferably 0.5% to 70% by mass and more preferably 1% to 50% by mass with respect to the total mass (100% by mass) of the organic semiconductor composition.

1. 1. 2. Migration Inhibitor

The organic semiconductor composition according to the present embodiment contains at least one kind of migration inhibitor selected from a compound represented by the following Formula (I) (hereinafter, referred to as a "compound (I)" as well), a compound represented by the following Formula (II) (hereinafter, referred to as a "compound (II)" as well), and a compound represented by the following Formula (III) (hereinafter, referred to as a "compound (III)" as well).

In the present invention, the migration means a phenomenon in which a conductive substance such as a metal is ionized, and the ion migrates. The migration inhibitor means a substance that functions to inhibit migration although the migration inhibitor is not limited to the substance.

The organic semiconductor composition according to the present embodiment contains at least one kind of migration inhibitor (hereinafter, referred to as a "specific migration inhibitor" as well) among the compounds (I) to (III). Accordingly, the composition can form an organic thin film transistor having excellent insulation reliability while inhibiting the deterioration of mobility. Hereinafter, the mechanism that brings about such an effect will be specifically described.

If voltage is applied in a state where the organic semiconductor layer in the organic thin film transistor has absorbed moisture, metal ions are generated from the electrode, and migration easily occurs. Particularly, the absorption of moisture into the organic semiconductor layer easily occurs in the interface between the organic semiconductor layer and other layers (or the air), and the eluted metal ions migrate to the vicinity of the interface. As a result, the metal derived from the electrode is precipitated in the vicinity of the interface of the organic semiconductor layer, and migration occurs.

In contrast, in a case where the antioxidant described in JP2004-88094A is added to the organic semiconductor composition, because the antioxidant and the organic semiconductor material are highly compatible with each other, the crystal growth of the organic semiconductor layer is hindered, or the antioxidant itself becomes a carrier trap, and hence the mobility deteriorates.

Hereinafter, first, the mechanism that operates when the compound (I) and the compound (II) are used will be specifically described.

The compound (I) and the compound (II) have many polar groups. Therefore, these compounds excellently interact with the electrode and are easily adsorbed onto the electrode. By the reduction of the compound (I) and the compound (II) adsorbed onto the electrode into metal ions, the occurrence of migration can be effectively inhibited.

Furthermore, the compound (I) and the compound (II) tend to exist in the vicinity of the electrode of the organic semiconductor layer. Therefore, the layer (organic semiconductor layer) formed of the organic semiconductor composition tends to be formed in a state where the organic semiconductor layer is separated into a layer containing the compound (I) and the compound (II) as main components and a layer containing the organic semiconductor material as a main component. Accordingly, the compound (I) and the compound (II) do not easily hinder the crystal growth of the organic semiconductor material and do not easily become a carrier trap, and hence the deterioration of mobility of the organic thin film transistor can be inhibited.

Next, the mechanism that operates when the compound (III) is used will be described.

The compound (III) is hydrophobic, and accordingly, the compound tends to exist in the interface (particularly, upper side) of the organic semiconductor layer. As a result, the moisture absorption that easily occurs in the vicinity of the interface of the organic semiconductor layer can be inhibited, and hence the occurrence of migration can be effectively inhibited.

Furthermore, because the compound (III) tends to exist in the interface of the organic semiconductor layer, the layer (organic semiconductor layer) formed of the organic semiconductor composition tends to be formed in a state where the organic semiconductor layer is separated into a layer containing the compound (III) as a main component and a layer containing the organic semiconductor material as a main component. Accordingly, the compound (III) does not easily hinder the crystal growth of the organic semiconductor material and does not easily become a carrier trap, and hence the deterioration of mobility of the organic thin film transistor can be inhibited.

The organic semiconductor composition may contain one kind of the aforementioned specific migration inhibitor singly, or contain two or more kinds thereof. However, if at least one kind of compound selected from the compound (I) and the compound (II) is used in combination with the compound (III), due to a synergistic effect of the property of the compounds (I) and (II) easily adsorbed onto the electrode and the hydrophobicity of the compound (III), the mobility and the insulation reliability are further improved in some cases.

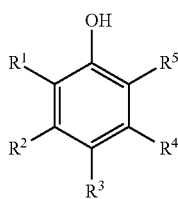

(I)

In Formula (I), $R^1$ to $R^5$ each independently represent a hydrogen atom or a substituent. Here, at least one of $R^1$ or $R^5$ is —OH, —OR$^{26}$, —SR$^{27}$, —NHCOR$^{28}$, or —NHSO$_2$R$^{29}$, or $R^3$ is —SR$^{27}$, —NHCOR$^{28}$, or —NHSO$_2$R$^{29}$. $R^{26}$ to $R^{29}$ each independently represent an alkyl group or an aryl group.

Examples of the aforementioned substituent include a halogen atom, an alkyl group (including a cycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, aryloxycarbonyloxy, an amino group (including an anilino group), an acylamino group, an aminocarbonylamino group, an alkoxycarbonylamino group, an aryloxycarbonylamino group, a sulfamoylamino group, alkyl and aryl sulfonylamino groups, a mercapto group, an alkylthio group, an arylthio group, a heterocyclic thio group, a sulfamoyl group, a sulfo group, alkyl and aryl sulfinyl groups, alkyl and aryl sulfonyl groups, an acyl group, an aryloxycarbonyl group, an alkoxycarbonyl group, a carbamoyl group, an arylazo group, a heterocyclic azo group, an imide group, a phosphino group, a phosphinyl group, a phosphinyloxy group, a phosphinylamino group, a silyl group, and a combination of these.

More specifically, the substituent means a halogen atom (for example, a chlorine atom, a bromine atom, or an iodine atom), an alkyl group [it means a substituted or unsubstituted linear, branched, or cyclic alkyl group; these also include an alkyl group (preferably an alkyl group having 1 to 30 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably a substituted or unsubstituted cycloalkyl group having 3 to 30 carbon atoms, for example, cyclohexyl, cyclopentyl, or 4-n-dodecylcyclohexyl), a bicycloalkyl group (preferably a substituted or unsubstituted bicycloalkyl group having 5 to 30 carbon atoms, that is, a monovalent group obtained by removing one hydrogen atom from bicycloalkane having 5 to 30 carbon atoms, for example, bicyclo[1.2.2]heptan-2-yl or bicyclo[2.2.2]octan-3-yl), a tricyclo structure consisting of a large number of cyclic structures, and the like. An alkyl group in a substituent described below (for example, an alkyl group of an alkylthio group) also means the alkyl group having the concept described above], an alkenyl group [it means a substituted or unsubstituted linear, branched, or cyclic alkenyl group; these also include an alkenyl group (preferably a substituted or unsubstituted alkenyl group having 2 to 30 carbon atoms, for example, vinyl, allyl, prenyl, geranyl, or oleyl), a cycloalkenyl group (preferably a substituted or unsubstituted cycloalkenyl group having 3 to 30 carbon atoms, that is, a monovalent group obtained by removing one hydrogen atom from cycloalkene having 3 to 30 carbon atoms, for example, 2-cyclopenten-1-yl or 2-cyclohexen-1-yl), and a bicycloalkenyl group (a substituted or unsubstituted bicycloalkenyl group and preferably a substituted or unsubstituted bicycloalkenyl group having 5 to 30 carbon atoms, that is, a monovalent group obtained by removing one hydrogen atom from bicycloalkene having one double bond, for example, bicyclo[2.2.1]hept-2-en-1-yl or bicyclo[2.2.2]oct-2-en-4-yl)], an alkynyl group (preferably a substituted or unsubstituted alkynyl group having 2 to 30 carbon atoms, for example, an ethynyl, propargyl, or trimethylsilylethynyl group), an aryl group (preferably a substituted or unsubstituted aryl group having 6 to 30 carbon atoms, for example, phenyl, p-tolyl, naphthyl, m-chlorophenyl, or o-hexadecanoylaminophenyl), a heterocyclic group (preferably a monovalent group obtained by removing one hydrogen atom from a 5- or 6-membered substituted or unsubstituted aromatic or non-aromatic heterocyclic compound, and more preferably a 5- or 6-membered aromatic heterocyclic group having 3 to 30 carbon atoms, for example, 2-furanyl, 2-thienyl, 2-pyrimidinyl, or 2-benzothiazolinyl), a cyano group,
a hydroxyl group,
a nitro group,
a carboxyl group, an alkoxy group (preferably a substituted or unsubstituted alkoxy group having 1 to 30 carbon atoms, for example, methoxy, ethoxy, isopropoxy, t-butoxy, n-octyloxy, or 2-methoxyethoxy), an aryloxy group (preferably a substituted or unsubstituted aryloxy group having 6 to 30 carbon atoms, for example, phenoxy, 2-methylphenoxy, 4-t-butylphenoxy, 3-nitrophenoxy, or 2-tetradecanoylaminophenoxy), a silyloxy group (preferably a silyloxy group having 3 to 20 carbon atoms, for example, trimethylsilyloxy or t-butyldimethylsilyloxy), a heterocyclic oxy group (preferably a substituted or unsubstituted heterocyclic oxy group having 2 to 30 carbon atoms, for example, 1-phenyltetrazol-5-oxy or 2-tetrahydropyranyloxy), an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, for example, formyloxy, acetyloxy, pivaloyloxy, stearoyloxy, benzoyloxy, or p-methoxyphenylcarbonyloxy), a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, or N-n-octylcarbamoyloxy), an alkoxycarbonyloxy group (preferably a substituted or unsubstituted alkoxycarbonyloxy group having 2 to 30 carbon atoms, for example, methoxycarbonyloxy, ethoxycarbonyloxy, t-butoxycarbonyloxy, or n-octylcarbonyloxy), an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, or p-n-hexadecyloxyphenoxycarbonyloxy), an amino group (preferably an amino group, a substituted or unsubstituted alkylamino group having 1 to 30 carbon atoms, or a substituted or unsubstituted anilino group having 6 to 30 carbon atoms, for example, amino, methylamino, dimethylamino, anilino, N-methyl-anilino, or diphenylamino), an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms, for example, formylamino, acetylamino, pivaloylamino, lauroylamino, benzoylamino, or 3,4,5-tri-n-octyloxyphenylcarbonylamino), an aminocarbonylamino group (preferably substituted or unsubstituted aminocarbonylamino having 1 to 30 carbon atoms, for example, carbamoylamino, N,N-dimethylaminocarbonylamino, N,N-diethylaminocarbonylamino, or morpholinocarbonylamino), an alkoxycarbonylamino group (preferably a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methyl-methoxycarbonylamino), an aryloxycarbonylamino group (preferably a substituted or unsubstituted aryloxycarbonylamino group having 7 to 30 carbon atoms, for example, phenoxycarbonylamino, p-chlorophenoxycarbonylamino, or m-n-octyloxyphenoxycarbonylamino), a sulfamoylamino group (preferably a substituted or unsubstituted sulfamoylamino group having 0 to 30 carbon atoms, for example, sulfamoylamino, N,N-dimethylaminosulfonylamino, or N-n-octylaminosulfonylamino), alkyl and aryl sulfonylamino groups (preferably substituted or unsubstituted alkylsulfonylamino having 1 to 30 carbon atoms and substituted or unsubstituted arylsulfonylamino having 6 to 30 carbon atoms, for example, methylsulfonylamino, butylsulfonylamino, phenylsulfonylamino, or 2,3,5-trichlorophenylsulfonylamino, or p-methylphenylsulfonylamino), a mercapto group, an alkylthio group (preferably a substituted or unsubstituted alkylthio group having 1 to 30 carbon atoms, for example, methylthio, ethylthio, or n-hexadecylthio), an arylthio group (preferably substituted or unsubstituted arylthio having 6 to 30 carbon atoms, for example, phenylthio, p-chlorophenylthio, or m-methoxyphenylthio), a heterocyclic thio group (preferably a substituted or unsubstituted heterocyclic thio group having 2 to 30 carbon atoms, for example, 2-benzothiazolylthio or 1-phenyltetrazol-5-ylthio), a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, or N—(N'-phenylcarbamoyl)sulfamoyl), a sulfo group, alkyl and aryl sulfinyl groups (preferably a substituted or unsubstituted alkylsulfinyl group having 1 to 30 carbon atoms and a substituted or unsubstituted arylsulfinyl group having 6 to 30 carbon atoms, for example, methylsulfinyl, ethylsulfinyl, phenylsulfinyl, or p-methylphenylsulfinyl), alkyl and aryl sulfonyl groups (preferably a substituted or unsubstituted alkylsulfonyl group having 1 to 30 carbon atoms and a substituted or unsubstituted arylsulfonyl group having 6 to 30 carbon atoms, for example, methylsulfonyl, ethylsulfonyl, phenylsulfonyl, or p-methylphenylsulfonyl), an acyl group (preferably a formyl group, a substituted or unsubstituted alkylcarbonyl group having 2 to 30 carbon atoms, a substituted or unsubstituted arylcarbonyl group having 7 to 30 carbon atoms, or a substituted or unsubstituted heterocyclic carbonyl group having 4 to 30 carbon atoms that is bonded to a carbonyl group through the carbon atoms, for example, acetyl, pivaloyl, 2-chloroacetyl, stearoyl, benzoyl, p-n-octyloxyphenylcarbonyl, 2-pyridylcarbonyl, or 2-furylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl), a carbamoyl group (preferably substituted or unsubstituted carbamoyl having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl), an arylazo group and a heterocyclic azo group (preferably a substituted or unsubstituted arylazo group having 6 to 30 carbon atoms and a substituted or unsubstituted heterocyclic azo group having 3 to 30 carbon atoms, for example, phenylazo, p-chlorophenylazo, or 5-ethylthio-1,3,4-thiadiazol-2-ylazo), an imide group (preferably N-succinimide or N-phthalimide), a phosphino group (preferably a substituted or unsubstituted phosphino group having 2 to 30 carbon atoms, for example, dimethylphosphino, diphenylphosphino, or methylphenoxyphosphino), a phosphinyl group (preferably a substituted or unsubstituted phosphinyl group having 2 to 30 carbon atoms, for example, phosphinyl, dioctyloxyphosphinyl, or diethoxyphosphinyl), a phosphinyloxy group (preferably a substituted or unsubstituted phosphinyloxy group having 2 to 30 carbon atoms, for example, diphenoxyphosphinyloxy or dioctyloxyphosphinyloxy), a phosphinylamino group (preferably a substituted or unsubstituted phosphinylamino group having 2 to 30 carbon atoms, for example, dimethoxyphosphinylamino or dimethylaminophosphinylamino), and a silyl group (preferably a substituted or unsubstituted silyl group having 3 to 30 carbon atoms, for example, trimethylsilyl, t-butyldimethylsilyl, or phenyldimethylsilyl).

Among the above substituents, those having a hydrogen atom may be substituted with the aforementioned groups after the hydrogen atom is removed. Examples of such substituents include an alkylcarbonylaminosulfonyl group, an arylcarbonylaminosulfonyl group, an alkylsulfonylaminocarbonyl group, an arylsulfonylaminocarbonyl group, and the like. Examples of these include methylsulfonylaminocarbonyl, p-methylphenylsulfonylaminocarbonyl, acetylaminosulfonyl, a benzoylaminosulfonyl group, and the like.

In the present invention, a "substituent" means the aforementioned group.

In the present invention, in a case where a substituent is simply referred to as an "alkyl group" or an "aryl group", unless otherwise specified, the alkyl group represents an alkyl group which may have a substituent (that is, a substituted or unsubstituted alkyl group), and the aryl group represents an aryl group which may have a substituent (that is, a substituted or unsubstituted aryl group).

In the present invention, in a case where a substituent is simply referred to as an "aliphatic group, an "aromatic group", or a "heterocyclic group", unless otherwise specified, the aliphatic group represents an aliphatic group which may have a substituent (that is, a substituted or unsubstituted aliphatic group), the aromatic group represents an aromatic group which may have a substituent (that is, a substituted or unsubstituted aromatic group), and the heterocyclic group represents a heterocyclic group which may have a substituent (that is, a substituted or unsubstituted heterocyclic group).

The alkyl group having a substituent (that is, a substituted alkyl group) does not include an alkyl group (for example, a tert-butyl group) substituted with an unsubstituted alkyl group, and an alkyl group substituted with an unsubstituted alkyl group is classified into an "unsubstituted alkyl group".

To each of the alkyl group and the aryl group represented by $R^{26}$ to $R^{29}$, the description relating to the alkyl group and the aryl group in the aforementioned substituents can be applied, and hence the description thereof will not be repeated.

The compound (I) satisfies a condition in which at least one of $R^1$ or $R^5$ is —OH, —OR$^{26}$, —SR$^{27}$, —NHCOR$^{28}$, or —NHSO$_2$R$^{29}$, or $R^3$ is —SR$^{27}$, —NHCOR$^{28}$, or —NHSO$_2$R$^{29}$.

If at least one of $R^1$ or $R^5$ in the ortho-position of Formula (I) is a specific polar group (—OH, —OR$^{26}$, —SR$^{27}$, —NHCOR$^{28}$, or —NHSO$_2$R$^{29}$), the interaction between the electrode and the compound becomes excellent, and hence the insulation reliability of the organic thin film transistor becomes excellent.

At least one of $R^1$ or $R^5$ is preferably —OH or —OR$^{26}$ among the aforementioned specific polar groups. $R^{26}$ is more preferably an alkyl group, even more preferably an unsubstituted alkyl group, and particularly preferably an unsubstituted alkyl group having 1 to 12 carbon atom. If $R^{26}$ is such an alkyl group, the interaction between the electrode and the compound tends to be further improved.

In a case where at least one of $R^1$ or $R^5$ of Formula (I) is the specific polar group, it is preferable that at least one of $R^2$, $R^3$, or $R^4$ is the aforementioned substituent. It is more preferable that $R^3$ is the aforementioned substituent. In this case, $R^2$ to $R^4$ are preferably a nonpolar group (for example, an unsubstituted alkyl group or an unsubstituted aryl group).

If $R^3$ in the para-position of Formula (I) is the specific polar group (—SR$^{27}$, —NHCOR$^{28}$, or —NHSO$_2$R$^{29}$), the interaction between the electrode and the organic semiconductor layer is further improved, and the organic semiconductor tends to be formed in a state where it is separated into a layer containing the compound (I) as a main component and a layer containing the organic semiconductor material as a main component. Therefore, the mobility of the organic thin film transistor prepared from the organic semiconductor composition becomes excellent. Furthermore, an oxidation potential is reduced, and the metal ions are easily reduced. As a result, the insulation reliability tends to be improved.

In a case where $R^3$ is —SR$^{27}$, $R^{27}$ is more preferably an alkyl group.

In a case where $R^3$ is —NHCOR$^{28}$ or —NHSO$_2$R$^{29}$, $R^{28}$ and $R^{29}$ are preferably an alkyl group, more preferably an unsubstituted alkyl group, and even more preferably an unsubstituted alkyl group having 1 to 12 carbon atoms.

Preferred specific examples of the compound (I) include compounds represented by the following Formulae (I-1) to (I-16). In the formulae, "Me" represents a methyl group.

(I-1)

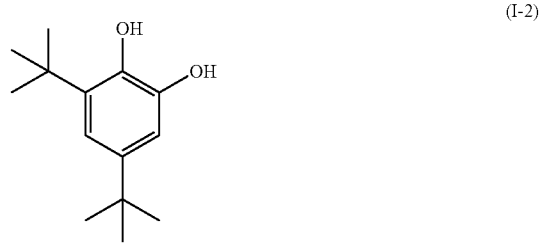

(I-2)

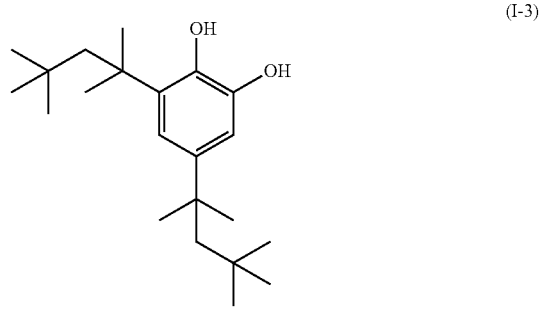

(I-3)

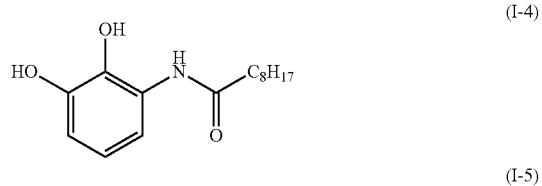

(I-4)

(I-5)

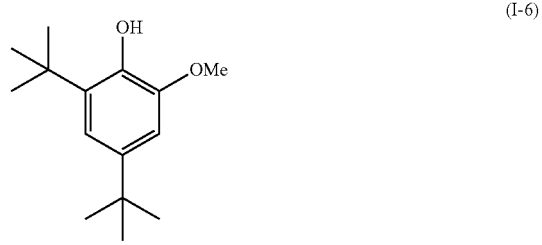

(I-6)

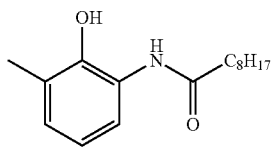
(I-7)

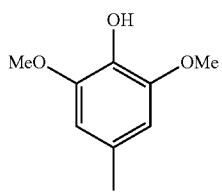
(I-8)

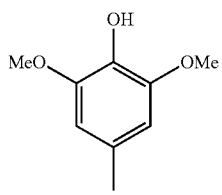
(I-9)

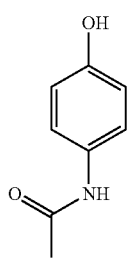
(I-10)

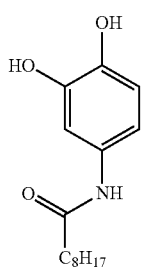
(I-11)

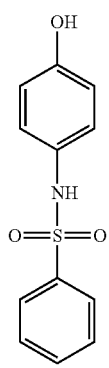
(I-12)

(I-13)

(I-14)

(I-15)

(I-16)

(II)

In Formula (II), $R^6$ to $R^{13}$ represent a hydrogen atom or a substituent. Here, at least one of $R^6$, $R^7$, $R^8$, $R^9$, $R^{10}$, $R^{11}$, $R^{12}$, or $R^{13}$ is —OH, —OR$^{26}$, —SR$^{27}$, —NHCOR$^{28}$, or —NHSO$_2$R$^{29}$. $R^{26}$ to $R^{29}$ each independently represent an alkyl group or an aryl group. $R^{14}$ and $R^{15}$ each independently represent a hydrogen atom, an aliphatic group, an aromatic group, a heterocyclic group, —OH, —OR$^{30}$, —SR$^{31}$, or —NR$^{32}$R$^{33}$. $R^{30}$ to $R^{33}$ each independently represent an alkyl group or an aryl group. Here, there is no case where both of $R^{14}$ and $R^{15}$ simultaneously represent a group selected from —OH, —OR$^{30}$, —SR$^{31}$, and —NR$^{32}$R$^{33}$. $R^{14}$ and $R^{15}$ may form a ring by being bonded to each other.

To the substituent, the alkyl group, and the aryl group in Formula (II), the description in Formula (I) described above can be applied, and hence the description thereof will not be repeated.

Examples of the aliphatic group include an alkyl group (including a cycloalkyl group), an alkenyl group (including a cycloalkenyl group and a bicycloalkenyl group), an alkynyl group, and the like. To specific examples of these groups, the description in the Formula (I) described above can be applied, and hence the description thereof will not be repeated.

Examples of the aromatic group include an aryl group and the like. To specific examples of the aryl group, the description in the Formula (I) described above can be applied, and hence the description thereof will not be repeated.

To specific examples of the heterocyclic group, the description in Formula (I) described above can be applied, and hence the description thereof will not be repeated.

At least one of $R^6$, $R^7$, $R^8$, $R^9$, $R^{10}$, $R^{11}$, $R^{12}$, or $R^{13}$ in Formula (II) is —OH, —OR$^{26}$, —SR$^{27}$, —NHCOR$^{28}$, or —NHSO$_2$R$^{29}$, preferably —OR$^{26}$ or —OH, and more preferably —OR$^{26}$. At least one of $R^6$, $R^7$, $R^8$, $R^9$, $R^{10}$, $R^{11}$, $R^{12}$, or $R^{13}$ is the aforementioned specific functional group. It is preferable that at least one of $R^6$ or $R^{13}$ is —OH, —OR$^{26}$, —SR$^{27}$, —NHCOR$^{28}$, or —NHSO$_2$R$^{29}$, because then the insulation reliability and the mobility can be satisfied at a higher level. For the same reason, it is more preferable that both of $R^6$ or $R^{13}$ simultaneously represent —OH, —OR$^{26}$, —SR$^{27}$, —NHCOR$^{28}$, or —NHSO$_2$R$^{29}$.

$R^{26}$ to $R^{29}$ each independently represent an alkyl group or an aryl group, preferably represent an unsubstituted alkyl group or an unsubstituted aryl group, even more preferably represent an unsubstituted alkyl group, and particularly preferably represent an unsubstituted alkyl group having 1 to 12 carbon atoms.

$R^{14}$ and $R^{15}$ each independently preferably represent a hydrogen atom, an aliphatic group, or an aromatic group, more preferably represent a hydrogen atom, an unsubstituted aliphatic group, or an unsubstituted aromatic group, and even more preferably represent a hydrogen atom or an unsubstituted aliphatic group. Such an aliphatic group is preferably an alkyl group, and more preferably an alkyl group having 1 to 12 carbon atoms. If the aliphatic is such an alkyl group, both of the performances, the insulation reliability and the mobility, can be satisfied at a higher level.

$R^{14}$ and $R^{15}$ may form a ring by being bonded to each other. In this case, the structure thereof may include any one of bonding forms including a single bond, a double bond, and a triple bond.

Herein, there is no case where both of $R^{14}$ and $R^{15}$ simultaneously represent a group selected from —OH, —OR$^3$, —SR$^{31}$, and —NR$^{32}$R$^{33}$. If both of $R^{14}$ and $R^{15}$ simultaneously represent the aforementioned group, at least one of the insulation reliability and the mobility may deteriorate.

Preferred specific examples of the compound (II) include compounds represented by the following Formulae (II-1) to (II-11). In the formulae, "Me" represents a methyl group.

(II-1)

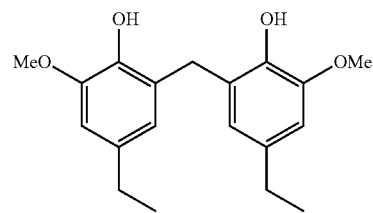

(II-2)

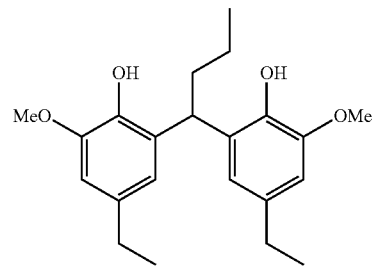

(II-3)

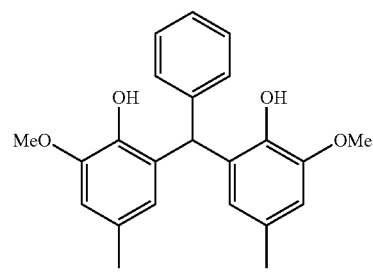

(II-4)

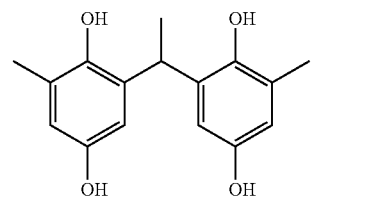

(II-5)

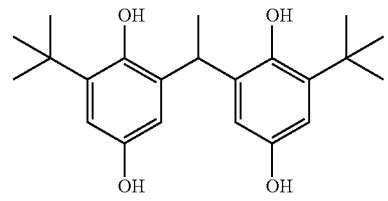

(II-6)

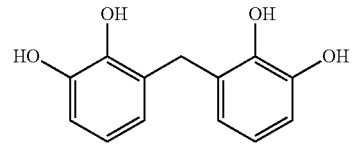

(II-7)

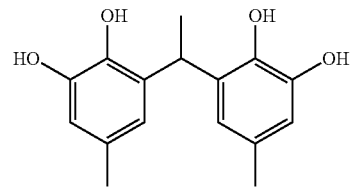

(II-8)

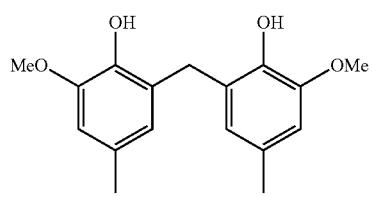

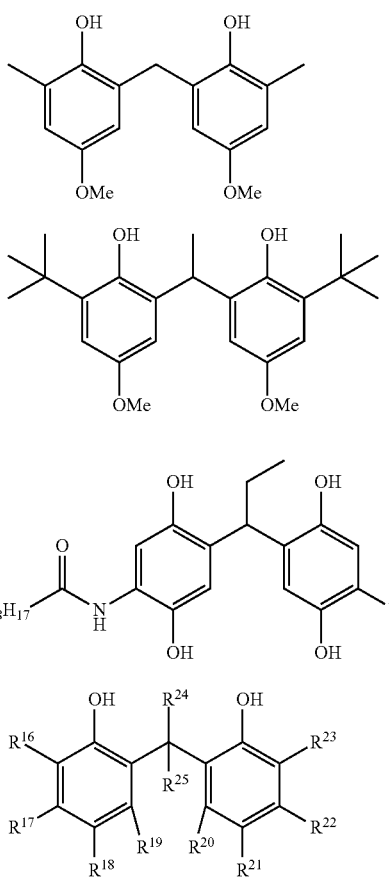

In Formula (III), $R^{16}$ to $R^{23}$ each independently represent a hydrogen atom, an aliphatic group, or an aromatic group. $R^{24}$ and $R^{25}$ each independently represent a hydrogen atom, an aliphatic group, an aromatic group, or a heterocyclic group. Here, there is no case where both of $R^{24}$ and $R^{25}$ simultaneously represent a hydrogen atom. $R^{24}$ and $R^{25}$ may form a ring by being bonded to each other.

Examples of the aliphatic group in Formula (III) include an alkyl group (including a cycloalkyl group), an alkenyl group (including a cycloalkenyl group and a bicycloalkenyl group), an alkynyl group, and the like. To specific examples of these groups, the description in Formula (I) described above can be applied, and hence the description thereof will not be repeated.

Examples of the aromatic group include an aryl group. To specific examples of the aryl group, the description in Formula (I) described above can be applied, and hence the description thereof will not be repeated.

To specific examples of the heterocyclic group, the description in Formula (I) described above can be applied, and hence the description thereof will not be repeated.

$R^{16}$ to $R^{23}$ each independently represent a hydrogen atom, an aliphatic group, or an aromatic group, and preferably represent an unsubstituted aliphatic group or an unsubstituted aromatic group.

It is preferable that both of $R^{16}$ and $R^{23}$ simultaneously represent a hydrogen atom, an aliphatic group, or an aromatic group, because then the insulation reliability and the mobility can be satisfied at a higher level. For the same reason, both of $R^{16}$ and $R^{23}$ more preferably simultaneously represent a hydrogen atom, an unsubstituted aliphatic group, or an unsubstituted aromatic group, even more preferably simultaneously represent an unsubstituted aliphatic group. Such an aliphatic group is preferably an alkyl group, and more preferably an alkyl group having 1 to 12 carbon atoms.

$R^{24}$ and $R^{25}$ each independently represent a hydrogen atom, an aliphatic group, an aromatic group, or a heterocyclic group, more preferably represent a hydrogen atom, an unsubstituted aliphatic group, an unsubstituted aromatic group, or an unsubstituted heterocyclic group, and even more preferably represent a hydrogen atom or an unsubstituted aliphatic group. Such an aliphatic group is preferably an alkyl group, and more preferably an alkyl group having 3 to 12 carbon atoms. If the aliphatic group is such an alkyl group, both of the performance, the insulation reliability and the mobility, can be satisfied at a high level.

$R^{24}$ and $R^{25}$ may form a ring by being bonded to each other. In this case, the structure thereof may include any one of bonding forms including a single bond, a double bond, and a triple bond.

Herein, there is no case where both of $R^{24}$ and $R^{25}$ simultaneously represent a hydrogen atom. If both of $R^{24}$ and $R^{25}$ simultaneously represent a hydrogen atom, the compound (III) does not have sufficient hydrophobicity, and hence both of the performances, the insulation reliability and the mobility, deteriorate.

Preferred specific examples of the compound (III) include compounds represented by the following Formulae (III-1) to (III-11).

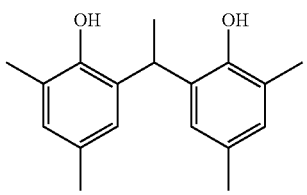

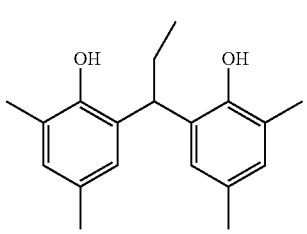

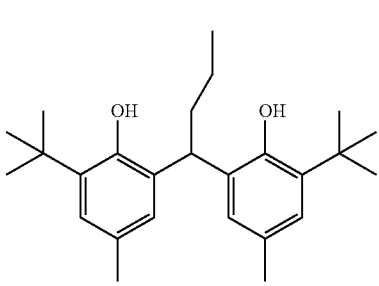

-continued

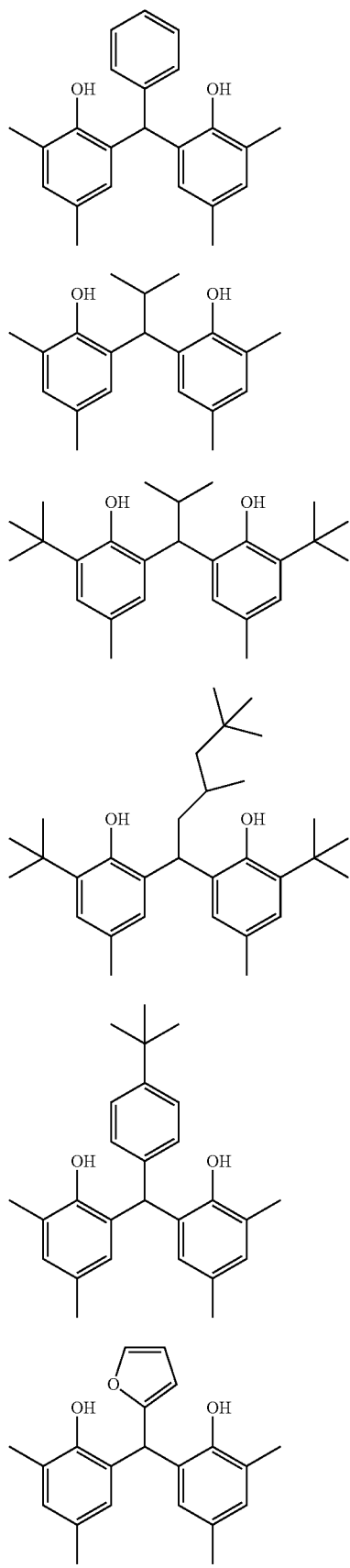

(III-4)
(III-5)
(III-6)
(III-7)
(III-8)
(III-9)

-continued

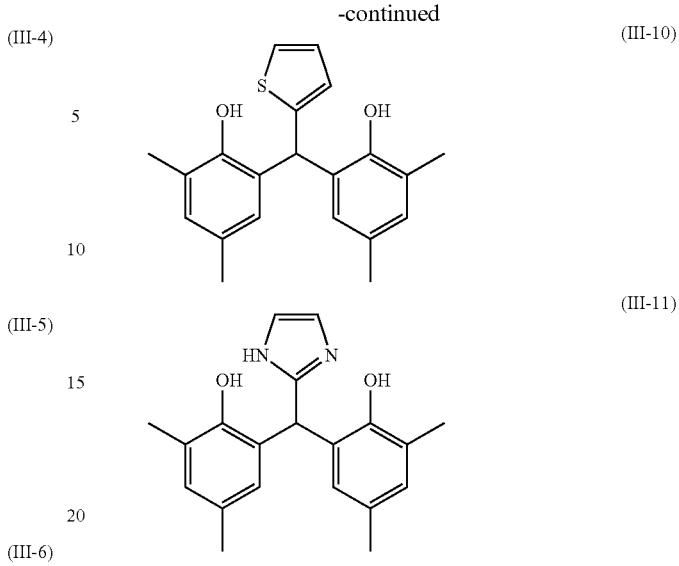

(III-10)
(III-11)

Among the specific migration inhibitors described above, those having an oxidation potential of equal to or higher than 0.4 V and equal to or lower than 1.6 V are preferably used, and those having an oxidation potential of equal to or higher than 0.5 V and lower than 1.1 V are more preferably used. If the oxidation-reduction potential is within the above range, the ability to reducing the metal ions is further improved, and the insulation reliability tends to be further improved. If the oxidation-reduction potential is equal to or higher than 0.4 V, the decomposition of the migration inhibitor caused by heating is inhibited (that is, heat stability becomes excellent). Therefore, at the time of manufacturing the organic thin film transistor, the transistor is not easily affected by heating (described later), and the performance thereof is excellently demonstrated.

In the present invention, an oxidation-reduction potential can be measured according to cyclic voltammetry by using a device equivalent to an electrochemical analyzer VMP3 (manufactured by Bio-Logic Science Instruments).

The content of the aforementioned specific migration inhibitor is, with respect to 100% by mass of the organic semiconductor material, preferably equal to or greater than 30% by mass and equal to or less than 500% by mass, more preferably equal to or greater than 40% by mass and equal to or less than 300% by mass, and even more preferably equal to or greater than 50% by mass and equal to or less than 200% by mass. If the content is equal to or greater than 30% by mass, at the time of forming the organic semiconductor layer by using the organic semiconductor composition, it is possible to make the layer excellently separated into a layer derived from the migration inhibitor and a layer derived from the organic semiconductor material, and hence the deterioration of mobility can be inhibited. In addition, if the content is equal to or less than 500% by mass, it is possible to excellently maintain the state in which the organic semiconductor layer is separated into the layer derived from the migration inhibitor and the layer derived from the organic semiconductor material.

All of the aforementioned compound (I), compound (II), and compound (III) can be synthesized by synthesis methods known in the related art. For example, the compound (I) can be synthesized according to the method described in U.S. Pat. No. 5,002,967A, the compound (II) can be synthesized according to the method described in Environmental Science and Technology, 1994, vol. 28, #4, p. 573-576, and the compound (III) can be synthesized according to the method described in Journal of the American Chemical Society, 1952, vol. 74, p. 3410.

1. 1. 3. Other Components

If necessary, the organic semiconductor composition according to the present embodiment may contain various additives within a range that does not impair the effects of the present invention.

One of those additives includes, for example, a polymer. The polymer is added for the purpose of, for example, maintaining the viscosity of the organic semiconductor composition within an appropriate range. The type of the polymer is not particularly limited, and known polymers can be used. Examples thereof include a polystyrene resin, an acryl resin, rubber, a thermoplastic elastomer, and the like.

Among these, as the polymer, a polymer compound having a benzene ring (a polymer having a benzene ring group-containing monomer unit) is preferable. The content of the benzene ring group-containing monomer unit is not particularly limited, but is preferably equal to or greater than 50 mol %, more preferably equal to or greater than 70 mol %, and even more preferably equal to or greater than 90 mol % in all of the monomer units. The upper limit is not particularly limited, but is preferably equal to or less than 100 mol %.

Examples of the polymer compound having a benzene ring include polystyrene, poly($\alpha$-methylstyrene), polyvinyl cinnamate, poly(4-vinylphenyl), poly(4-methylstyrene), and the like.

The weight-average molecular weight of the polymer is not particularly limited, but is preferably 1,000 to 2,000,000, more preferably 3,000 to 1,500,000, and even more preferably 100,000 to 1,000,000.

In a case where a solvent which will be described later is used, it is preferable that the solubility of the polymer in the used solvent is preferably higher than the solubility of the organic semiconductor material in the solvent. If the solubility is as described above, the mobility or the heat stability of the organic thin film transistor tends to become excellent.

In a case where the organic semiconductor composition contains the polymer, the content of the polymer is, with respect to 100 parts by mass of the organic semiconductor material, preferably 1 to 200 parts by mass, more preferably 10 to 150 parts by mass, and even more preferably 20 to 120 parts by mass. If the content is within the above range, the mobility or the temporal stability of the organic thin film transistor tends to become excellent.

From the viewpoint of improving the handleability of the organic semiconductor composition or improving the coating properties at the time of forming the organic semiconductor layer by coating, the organic semiconductor composition according to the present embodiment may contain a solvent. As the solvent, for example, it is possible to use organic solvents such as alcohols (for example, methanol, ethanol, n-propyl alcohol, isopropyl alcohol, and butanol), ketones (for example, acetone, methyl ethyl ketone, methyl isobutyl ketone, and cyclohexanone), esters (for example, ethyl acetate, isobutyl acetate, methyl oxyacetate, ethyl 3-ethoxypropionate, and propyl pyruvate), ethers (for example, ethylene glycol monomethyl ether, diethylene glycol dimethyl ether, tetrahydrofuran, and methyl cellosolve acetate), and aromatic hydrocarbons (for example, toluene, xylene, acetonitrile, $\gamma$-butyrolactone, dimethyl sulfoxide, dimethylformamide, and dimethylacetamide).

In a case where the solvent is added, it is preferable to add the solvent such that the concentration of the organic semiconductor material in the organic semiconductor composition becomes equal to or higher than 0.1% by mass and equal to or lower than 50% by mass. It is more preferable to add the solvent such that the concentration becomes equal to or higher than 1% by mass and equal to or lower than 10% by mass.

The organic semiconductor composition according to the present embodiment may contain additives generally used in an organic semiconductor composition, for example, a surfactant.

1. 1. 4. Preparation Method

The organic semiconductor composition according to the present embodiment can be prepared by mixing and stirring together the respective components described above, and the method is not particularly limited.

1. 2. Organic Thin Film Transistor

The aforementioned organic semiconductor composition is suitable as a composition for forming an organic semiconductor layer of an organic thin film transistor, an organic EL, an organic thin film solar cell, and the like. Particularly, the organic semiconductor composition is suitable as a composition for forming an organic semiconductor layer of an organic thin film transistor.

Hereinafter, an organic thin film transistor (organic field-effect transistor, OFET) prepared using the aforementioned organic semiconductor composition will be described.

An organic thin film transistor according to an embodiment of the present invention has an organic semiconductor layer prepared using the organic semiconductor composition and can additionally have a source electrode, a drain electrode, and a gate electrode. The organic thin film transistor according to the present embodiment has the organic semiconductor layer formed using the organic semiconductor composition. Therefore, the organic thin film transistor satisfies the mobility and the insulation reliability at a high level.

The structure of the organic thin film transistor according to the present embodiment is not particularly limited, and may have any of structures such as a bottom contact-type structure and a top contact-type structure.

Hereinafter, the organic thin film transistor according to an embodiment of the present invention will be described with reference to a drawing. FIG. 1 is a schematic cross-sectional view of a bottom contact-type organic thin film transistor 100 according to an embodiment of the present invention.

In the example shown in FIG. 1, the organic thin film transistor 100 has a substrate 10, a gate electrode 20, a gate insulating film 30, a source electrode 40, a drain electrode 42, an organic semiconductor layer 50, and a sealing layer 60. The organic semiconductor layer 50 is formed using the aforementioned organic semiconductor composition.

Hereinafter, the substrate, the gate electrode, the gate insulating film, the source electrode, the drain electrode, and the organic semiconductor layer as well as the method for forming each of these will be specifically described.

<Substrate>

The substrate plays a role of supporting the gate electrode, the source electrode, the drain electrode, and the like which will be described later.

The type of the substrate is not particularly limited, and examples thereof include a plastic substrate, a glass substrate, a ceramic substrate, and the like. Among these, from the viewpoints of the applicability to each device and the cost, a glass substrate or a plastic substrate is preferable.

Examples of the material of the plastic substrate include a thermosetting resin (for example, an epoxy resin, a phenol resin, a polyimide resin, or a polyester resin (such as PET or PEN)) and a thermoplastic resin (for example, a phenoxy resin, polyethersulfone, polysulfone, or polyphenylenesulfone).

Examples of the material of the ceramic substrate include alumina, aluminum nitride, zirconia, silicon, silicon nitride, silicon carbide, and the like.

Examples of the material of the glass substrate include soda glass, potash glass, borosilicate glass, quartz glass, aluminosilicate glass, lead glass, and the like.

<Gate Electrode>

Examples of the material of the gate electrode include a metal such as gold (Au), silver, aluminum, copper, chromium, nickel, cobalt, titanium, platinum, magnesium, calcium, barium, or sodium; a conductive oxide such as $InO_2$, $SnO_2$, or ITO; a conductive polymer such as polyaniline, polypyrrole, polythiophene, polyacetylene, or polydiacetylene; a semiconductor such as silicon, germanium, or gallium arsenide; a carbon material such as fullerene, carbon nanotubes, or graphite; and the like. Among these, a metal is preferable, and silver and aluminum are more preferable.

The thickness of the gate electrode is not particularly limited, but is preferably 20 to 200 nm.

The method for forming the gate electrode is not particularly limited, but examples thereof include a method of vacuum vapor-depositing or sputtering an electrode material onto a substrate, a method of coating a substrate with a composition for forming an electrode, a method of printing a composition for forming an electrode onto a substrate, and the like. Furthermore, in a case where the electrode is patterned, examples of the patterning method include a photolithography method; a printing method such as inkjet printing, screen printing, offset printing, or relief printing; a mask vapor deposition method; and the like.

<Gate Insulating Film>

Examples of the material of the gate insulating film include a polymer such as polymethyl methacrylate, polystyrene, polyvinylphenol, polyimide, polycarbonate, polyester, polyvinylalcohol, polyvinyl acetate, polyurethane, polysulfone, polybenzoxazole, polysilsesquioxane, an epoxy resin, or a phenol resin; an oxide such as silicon dioxide, aluminum oxide, or titanium oxide; a nitride such as silicon nitride; and the like. Among these materials, in view of the compatibility with the organic semiconductor layer, a polymer is preferable.

In a case where a polymer is used as the material of the gate insulating film, it is preferable to concurrently use a cross-linking agent (for example, melamine). By the concurrent use of the cross-linking agent, the polymer is cross-linked, and the durability of the formed gate insulating film is improved.

The film thickness of the gate insulating film is not particularly limited, but is preferably 100 to 1,000 nm.

The method for forming the gate insulating film is not particularly limited, but examples thereof include a method of coating a substrate, on which the gate electrode is formed, with a composition for forming a gate insulating film, a method of vapor-depositing or sputtering the material of the gate insulating film onto the substrate on which the gate electrode is formed, and the like. The method for coating the aforementioned substrate with the composition for forming a gate insulating film is not particularly limited, and it is possible to use a known method (a bar coating method, a spin coating method, a knife coating method, or a doctor blade method).

In a case where the gate insulating film is formed by coating the substrate with the composition for forming a gate insulating film, for the purpose of removing the solvent, causing cross-linking, or the like, the composition may be heated (baked) after coating. The heating conditions at the time of forming the gate insulating film are not particularly limited, but generally, it is preferable to perform heating for 5 to 120 minutes (preferably for 5 to 60 minutes) at 30° C. to 250° C. (preferably at 80° C. to 200° C.).

<Source Electrode and Drain Electrode>

Specific examples of the material of the source electrode and the drain electrode are the same as those exemplified above as the material of the gate electrode. Among the materials, a metal is preferable, and silver is more preferable.

The method for forming the source electrode and the drain electrode is not particularly limited, but examples thereof include a method of vacuum vapor-depositing or sputtering an electrode material onto a substrate on which the gate electrode and the gate insulating film are formed, a method of coating a substrate, on which the gate electrode and the gate insulating film are formed, with a composition for forming an electrode, a method of printing a composition for forming an electrode onto the substrate on which the gate electrode and the gate insulating film are formed, and the like. Specific examples of the patterning method are the same as those exemplified above for the gate electrode.

The channel length of the source electrode and the drain electrode is not particularly limited, but is preferably 5 to 30 μm.

The channel width of the source electrode and the drain electrode is not particularly limited, but is preferably 10 to 200 μm.

In the organic thin film transistor according to the present embodiment, among the source electrode, the drain electrode, and the gate electrode, at least one electrode can be silver. Among electrode materials, silver is easily ionized and easily causes migration. However, if a semiconductor layer is formed using the aforementioned organic semiconductor composition, the occurrence of migration can be sufficiently inhibited. Therefore, in a case where silver is used as an electrode material, the effects of the present invention are particularly markedly exhibited.

<Organic Semiconductor Layer>

The organic semiconductor layer is a layer formed using the organic semiconductor composition of the present invention.

The thickness of the organic semiconductor layer is not particularly limited, but is preferably 10 to 200 nm.

The method for forming the organic semiconductor layer is not particularly limited, but examples thereof include a method of coating the substrate, on which the gate electrode, the gate insulating film, the source electrode, and the drain electrode are formed, with a composition for an organic semiconductor, and the like. Specific examples of the method of coating the substrate with the organic semiconductor composition are the same as the examples of the method of coating the substrate with the composition for forming a gate insulating film. In a case where the organic semiconductor layer is formed by coating the substrate with the organic semiconductor composition, for the purpose of removing the solvent, causing cross-linking, or the like, the composition may be heated (baked) after coating.

The heating conditions at the time of forming the organic semiconductor layer are not particularly limited, but generally, it is preferable to perform heating for 5 to 120 minutes (preferably for 5 to 60 minutes) at 30° C. to 200° C. (preferably at 30° C. to 120° C.).

<Sealing Layer>

From the viewpoint of the durability, the organic thin film transistor of the present invention preferably includes a sealing layer as an outermost layer. In the sealing layer, a known sealant (composition for forming a sealing layer) can be used.

The thickness of the sealing layer is not particularly limited, but is preferably 0.2 to 10 μm.

The method for forming the sealing layer is not particularly limited, but examples thereof include a method of coating the substrate, on which the gate electrode, the gate insulating film, the source electrode, the drain electrode, and the organic semiconductor layer are formed, with a composition for forming a sealing layer, and the like. Specific examples of the method of coating the substrate with the composition for forming a sealing layer are the same as the examples of the method of coating the substrate with the composition for forming a gate insulating film. In a case where the sealing layer is formed by coating the substrate with the composition for forming a sealing layer, for the purpose of removing the solvent, causing cross-linking, or the like, the composition may be heated (baked) after coating.

The heating conditions at the time of forming the sealing layer are not particularly limited, but generally, it is preferable to perform heating for 5 to 120 minutes (preferably for 5 to 60 minutes) at 30° C. to 250° C. (preferably at 80° C. to 200° C.).

<Other Organic Thin Film Transistors>

Figure 2:
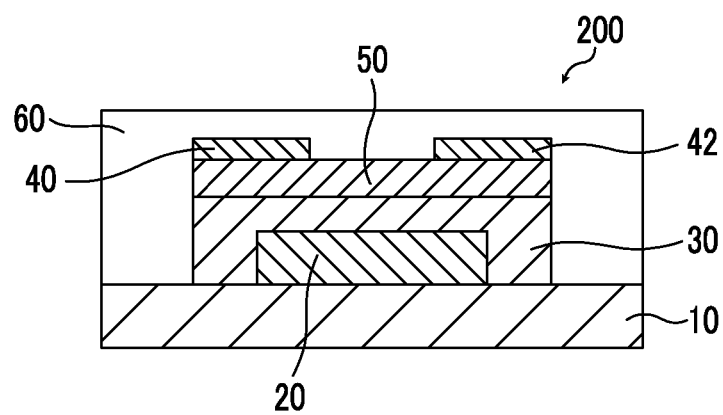
FIG. 2 is a schematic cross-sectional view of a top contact-type organic thin film transistor according to an embodiment of the present invention.

FIG. 2 is a schematic cross-sectional view of a top contact-type organic thin film transistor 200 according to an embodiment of the present invention.

In the example shown in FIG. 2, the organic thin film transistor 200 has a substrate 10, a gate electrode 20, a gate insulating film 30, a source electrode 40, a drain electrode 42, an organic semiconductor layer 50, and a sealing layer 60. The organic semiconductor layer 50 is formed using the aforementioned organic semiconductor composition of the present invention.

The substrate, the gate electrode, the gate insulating film, the source electrode, the drain electrode, the organic semiconductor layer, and the sealing layer are the same as described above, and hence the description thereof will not be repeated.

1. 3. Electronic Paper and Display Device

In electronic paper and a display device according to an embodiment of the present invention, the aforementioned organic thin film transistor is used in a display portion that displays an image. Except for this, the electronic paper and the display device can have known structure, and hence the description thereof will not be repeated.

As described above, the aforementioned organic thin film transistor has excellent mobility and insulation reliability. Accordingly, the organic thin film transistor is suitably used various electronic devices such as electronic paper or display devices.

2. Second Embodiment 2. 1. Organic Semiconductor Composition

An organic semiconductor composition according to an embodiment of the present invention contains an organic semiconductor material and at least one kind of migration inhibitor selected from a compound represented by the following Formula (IV) (hereinafter, referred to as a "compound (IV)" as well"), the aforementioned compound (II), and the aforementioned compound (III), in which the content of the migration inhibitor is equal to or greater than 30% by mass and equal to or less than 500% by mass with respect to 100% by mass of the organic semiconductor material.

In the present embodiment, in a case where there is a description of "specific migration inhibitor", it refers to a migration inhibitor selected from the compound (IV), the compound (II), and the compound (III).

In the organic semiconductor composition according to the present embodiment (that is, the organic semiconductor composition according to the second embodiment), the compound represented by the following Formula (IV) can be selected instead of the aforementioned compound (I) as a migration inhibitor, and the content of the migration inhibitor is necessarily within a specific range. In this respect, the organic semiconductor composition of the second embodiment is different from the organic semiconductor composition according to the first embodiment.

Hereinafter, regarding the organic semiconductor composition according to the present embodiment, the differences between this organic semiconductor composition and the organic semiconductor composition according to the first embodiment will be specifically described. Except for the differences, the organic semiconductor composition according to the present embodiment is the same as the organic semiconductor composition according to the first embodiment, and hence the description thereof will not be repeated.

<Compound (IV)>

The compound (IV) which can be used as the migration inhibitor according to the present embodiment is a compound represented by the following Formula (IV).

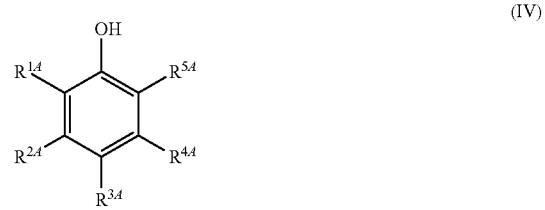

In Formula (IV), $R^{1A}$ to $R^{5A}$ each independently represent a hydrogen atom or a substituent. Here, at least one of $R^{1A}$, $R^{2A}$, $R^{3A}$, $R^{4A}$, or $R^{5A}$ is —OH, —OR$^{26}$, —SR$^{27}$, —NHCOR$^{28}$, or —NHSO$_2$R$^{29}$. $R^{26}$ to $R^{29}$ each independently represent an alkyl group or an aryl group.

To each of the alkyl group and the aryl group represented by $R^{26}$ to $R^{29}$, the description relating to the alkyl group and the aryl group in the substituent described above can be applied, and hence the description thereof will not be repeated.

In a case where all of the ortho-positions ($R^{1A}$ and $R^{5A}$) of the compound (IV) do not correspond to any of —OH, —OR$^{26}$, —SR$^{27}$, —NHCOR$^{28}$, or —NHSO$_2$R$^{29}$, the para-position ($R^{3A}$) may be a structure represented by —OH or —OR$^{26}$. Specific examples of the compound having such a structure include compounds represented by the following Formula (IV-1) and the following Formula (IV-2).

As described above, the compound (IV) is different from the compound (I) in terms of having the aforementioned structure.

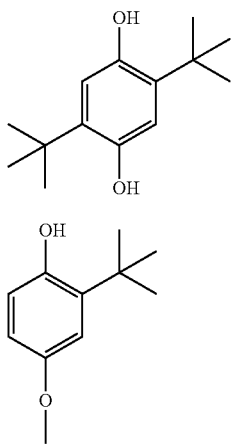

(IV-1)

(IV-2)

In a case where a compound, in which the para-position is substituted with —OH or —OR$^{26}$, is used among the above compounds (IV), at least one of the mobility and the insulating reliability tends to further deteriorate than in a case where the aforementioned compound (I) is used. However, by making the content of the migration inhibitor in the organic semiconductor composition according to the present embodiment fall into a specific range which will be described later, the mobility and the insulating reliability can become excellent.

In the compound represented by Formula (IV), at least one of R$^{14}$ or R$^{54}$ is preferably —OH, —OR$^{26}$, —SR$^{27}$, —NHCOR$^{28}$, or —NHSO$_2$R$^{29}$, or R$^{34}$ is preferably —SR$^{27}$, —NHCOR$^{28}$, or —NHSO$_2$R$^{29}$. The reason and the examples more preferred as the compound (IV) are the same as described above for the compound (I), and hence the description thereof will not be repeated.

Preferred specific examples of the compound (IV) satisfying the above conditions include the aforementioned compounds represented by Formulae (I-1) to (I-16) described above.

<Content of Migration Inhibitor>

The content of the specific migration inhibitor in the present embodiment needs to be equal to or greater than 30% by mass and equal to or less than 500% by mass with respect to 100% by mass of the organic semiconductor material. The content is preferably equal to or greater than 40% by mass and equal to or less than 300% by mass, and more preferably equal to or greater than 50% by mass and equal to or less than 200% by mass. If the content is equal to or greater than 30% by mass, at the time of forming the organic semiconductor layer by using the organic semiconductor composition, the layer is excellently separated into a layer derived from the migration inhibitor and a layer derived from the organic semiconductor material, and hence the deterioration of mobility can be inhibited. If the content is equal to or less than 500% by mass, it is possible to excellently maintain the state where the organic semiconductor layer is separated into the layer derived from the migration inhibitor and the layer derived from the organic semiconductor material. In contrast, if the content is less than 30% by mass, the organic semiconductor is not excellently separated into the layer derived from the migration inhibitor and the layer derived from the organic semiconductor material, and hence the mobility deteriorates. If the content is greater than 500% by mass, the content rate of the migration inhibitor in the layer derived from the organic semiconductor material becomes too high, and hence the mobility deteriorates.

2. 2. Organic Thin Film Transistor

An organic thin film transistor according to an embodiment of the present invention has a semiconductor layer prepared using the aforementioned organic semiconductor composition (that is, the organic semiconductor composition according to the second embodiment). Except for this, the organic thin film transistor according to the present embodiment is the same as the organic thin film transistor according to the first embodiment, and hence the description thereof will not be repeated.

2. 3. Electronic Paper and Display Device

Electronic paper and a display device according to an embodiment of the present invention use the aforementioned organic thin film transistor (the organic thin film transistor according to the second embodiment) in a display portion that displays an image. Except for this, the electronic paper and the display device according to the present embodiment are the same as the electronic paper and the display device of the first embodiment, and hence the description thereof will not be repeated.

EXAMPLES

Hereinafter, the present invention will be more specifically described based on examples, but the present invention is not limited to the examples.

For preparing organic semiconductor compositions, the following organic semiconductor materials (a-1) to (a-4) and migration inhibitors (b-1) to (b-13) were prepared.

(A) Organic Semiconductor Material
- a-1: TIPS pentacene (6,13-bis(triisopropylsilylethynyl) pentacene, manufactured by Sigma-Aldrich Co, LLC.)
- a-2: diF-TES-ADT (2,8-difluoro-5,11-bis(triethylsilylethynyl)anthradithiophene, manufactured by Sigma-Aldrich Co, LLC.)
- a-3: PBTTT-C12 (poly[2,5-bis(3-dodecylthiophen-2-yl) thieno[3,2-b]thiophene], manufactured by Sigma-Aldrich Co, LLC.)
- a-4: P3HT (poly(3-hexylthiophene), manufactured by Sigma-Aldrich Co, LLC.)

(B) Migration Inhibitor
- b-1: 3,5-di-tert-butyl-catechol (manufactured by TOKYO CHEMICAL INDUSTRY CO., LTD.)
- b-2: 2,6-dimethoxy-4-methylphenol (manufactured by TOKYO CHEMICAL INDUSTRY CO., LTD.)
- b-3: 2,5-di-tert-octylhydroquinone (manufactured by TOKYO CHEMICAL INDUSTRY CO., LTD.)
- b-4: 2-tert-butyl-4-methoxyphenol (manufactured by TOKYO CHEMICAL INDUSTRY CO., LTD.)
- b-5: 4-acetamidophenol (manufactured by TOKYO CHEMICAL INDUSTRY CO., LTD.)
- b-6: methyl 3-[(4-hydroxy-3,5-di-tert-butylphenyl)thio]propionate
- b-7: 2,2'-methylenebis(6-methoxy-p-cresol)
- b-8: 2,2'-butylidenebis(6-tert-butyl-p-cresol)
- b-9: 2,2'-butylidenebis(4-ethyl-6-methoxyphenol)
- b-10: IRGANOX-1076 (trade name, stearyl 3-(3,5-di-tert-butyl-4-hydroxyphenyl)propionate, manufactured by BASF SE)
- b-11: SUMILIZER MDP-S (trade name, 2,2'-methylenebis(6-tert-butyl-p-cresol), manufactured by Sumitomo Chemical Co., Ltd.)
- b-12: 4-aminophenol (manufactured by TOKYO CHEMICAL INDUSTRY CO., LTD.)

b-13: BHT (2,6-di-tert-butyl-p-cresol, manufactured by Wako Pure Chemical Industries, Ltd.)

Among the migration inhibitors, b-6 to b-9 were synthesized based on the methods described in the following documents. That is, b-6 was synthesized based on the method described in U.S. Pat. No. 5,002,967A, b-7 was synthesized based on the method described in Environmental Science and Technology, 1994, vol. 28, #4, p. 573-576, b-8 was synthesized based on the method described in Journal of the American Chemical Society, 1952, vol. 74, p. 3410, and b-9 was synthesized based on the method described in Environmental Science and Technology, 1994, vol. 28, #4, p. 573-576.

The structural formulae of the migration inhibitors b-1 to b-13 will be shown below.

b-1
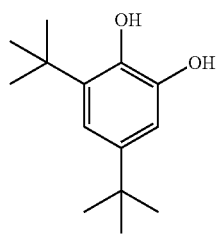

b-2
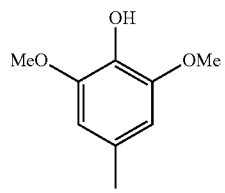

b-3
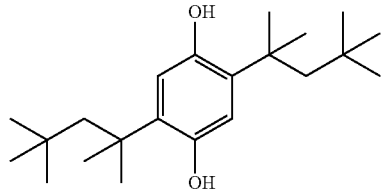

b-4
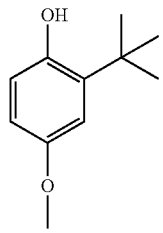

b-5
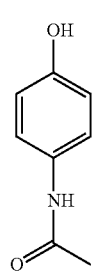

b-6
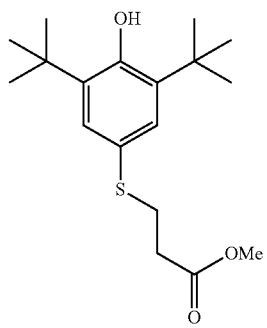

b-7
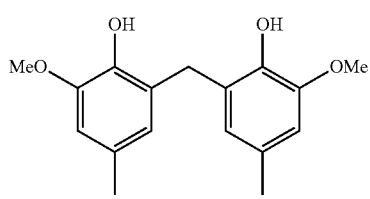

b-8
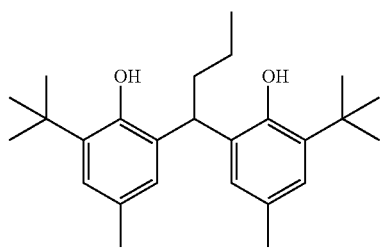

b-9
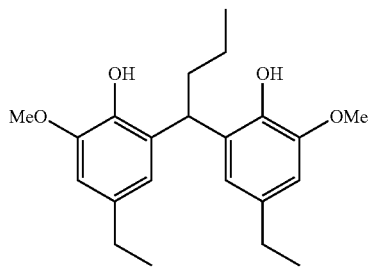

b-10
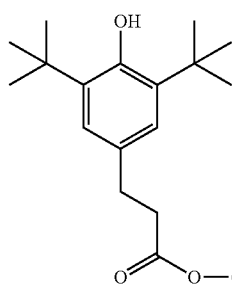

b-11
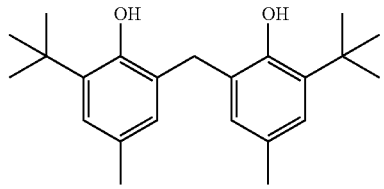

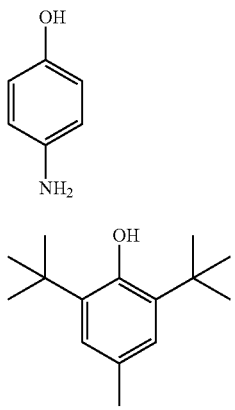

b-12 b-13

For the migration inhibitors b-1 to b-13, an oxidation potential (oxidation-reduction potential) was measured. Specifically, for a solution which was obtained by dissolving a supporting electrolyte (tetrabutylammonium perchlorate, manufactured by TOKYO CHEMICAL INDUSTRY CO., LTD.) at a concentration of 0.1 M and the migration inhibitor at a concentration of 0.1 M in dimethylformamide, the oxidation potential (potential at which a current value is maximized) was measured by cyclic voltammetry (under the following conditions) by using an electrochemical analyzer VMP3 (manufactured by Bio-Logic Science Instruments). The measurement conditions are as below, and the measurement results are shown in Table 1.

Working electrode: glass carbon electrode
Counter electrode: platinum electrode
Reference electrode: KCl saturated calomel electrode
Measurement temperature: 25° C.
Scanning rate: 10 mV/s
Scanning range: 0 V to 1.5 V

TABLE 1

| | Type of migration inhibitor | | | | | | | | | | | | |
|---|---|---|---|---|---|---|---|---|---|---|---|---|---|
| | b-1 | b-2 | b-3 | b-4 | b-5 | b-6 | b-7 | b-8 | b-9 | b-10 | b-11 | b-12 | b-13 |
| Oxidation potential (V) | 0.75 | 0.8 | 0.75 | 0.92 | 1.04 | 0.9 | 0.92 | 1.08 | 0.9 | 1.18 | 1.1 | 0.3 | 1.15 |

Example 1

(Preparation of Organic Semiconductor Composition)

The organic semiconductor material a-1 and the migration inhibitor b-1 were dissolved in toluene (organic semiconductor material a-1/migration inhibitor b-1=100 parts by mass/50 parts by mass, concentration of organic semiconductor material: 1.5% by mass), thereby preparing an organic semiconductor composition. The obtained organic semiconductor composition was named a composition 1.

(Preparation of Organic Thin Film Transistor (Element Preparation Method 1))

Al which will become a gate electrode was vapor-deposited (thickness: 50 nm) onto a glass substrate (Eagle XG: manufactured by Corning Incorporated). The Al layer was spin-coated with a composition for a gate insulating film (a propylene glycol monomethyl ether acetate (PGMEA) solution (solution concentration: 2% by mass) of polyvinylphenol/melamine=1 part by mass/i part by mass), and the composition was baked for 60 minutes at a temperature of 150° C., thereby forming a gate insulating film having a film thickness of 400 nm. Au was vapor-deposited onto the gate insulating film through a mask, thereby forming a source electrode and a drain electrode having a channel length of 25 µm and a channel width of 180 µm. The source and drain electrodes were spin-coated with the composition 1, and the composition 1 was baked for 15 minutes at a temperature of 140° C., thereby forming an organic semiconductor layer having a thickness of 100 nm. The organic semiconductor layer was spin-coated with Cytop CTL-107MK (composition for forming a sealing layer) (manufactured by ASAHI GLASS CO., LTD), and the Cytop CTL-107MK was baked for 20 minutes at a temperature of 140° C., thereby forming a sealing layer (uppermost layer) having a thickness of 2 µm. In this way, an organic thin film transistor (bottom contact-type) was obtained.

The present preparation method was named an element preparation method 1.

<Evaluation of Mobility>

The electrodes of the obtained organic thin film transistor were respectively connected to the terminals of a manual prober connected to a semiconductor parameter·analyzer (4155C, manufactured by Agilent Technologies Inc.), thereby evaluating the field effect transistor (FET). Specifically, by measuring the drain current-gate voltage (Id-Vg) characteristics, the field effect mobility ([$cm^2$/V·sec]) was calculated. The calculated field effect mobility was denoted by µ1.

Furthermore, according to the same procedure as described above, a comparative composition not containing a migration inhibitor was prepared. Thereafter, an organic thin film transistor was prepared according to the same procedure as in the preparation of an organic thin film transistor of Example 1, except that a comparative composition was used instead of the composition 1. The field effect mobility of the obtained organic thin film transistor was calculated according to the same procedure as followed for calculating µ1. The calculated field effect mobility was denoted by µ2.

From the calculated µ1 and µ2, µ1/µ2 was determined, and the mobility was evaluated according to the following criteria. The results are shown in Table 2. For the practical use, the organic thin film transistor is preferably evaluated to be A to C, more preferably evaluated to be A or B, and even more preferably evaluated to be A, from the viewpoint of the mobility.

A: $µ1/µ2 \geq 0.8$
B: $0.8 > µ1/µ2 \geq 0.5$
C: $0.5 > µ1/µ2 \leq 0.1$
D: $0.1 > µ1/µ2$ <Evaluation of Insulation Reliability>

By using EHS-221MD (manufactured by ESPEC CORP), the service life of the obtained organic thin film transistor was tested under the following conditions, thereby measuring a time taken for the value of resistance between the source electrode and the drain electrode to reach $1 \times 10^5 \Omega$.

The measured time was denoted by T1.
Temperature: 60° C.
Humidity: 60% RH
Pressure: 1.0 atm
Drain voltage: −40 V
Voltage between source/drain electrodes: 20 V Furthermore, according to the same procedure as in the evaluation of mobility, an organic thin film transistor was prepared by using the comparative composition not containing a migration inhibitor. For the obtained organic thin film transistor, the time taken for the value of resistance between the source/drain electrodes to reach $1 \times 10^5 \Omega$ was measured according to the same procedure as followed for measuring T1. The measured time was denoted by T2.

From the calculated T1 and T2, T1/T2 was determined, and the insulation reliability was evaluated according to the following criteria. The results are shown in Table 2. From the viewpoint of the insulation reliability, the organic thin film transistor is preferably evaluated to be A to C, more preferably evaluated to be A or B, and even more preferably evaluated to be A.

A: T1/T2≥5
B: 5>T1/T2≥2
C: 2>T1/T2≥1
D: 0.1≥T1/T2

Example 2

An organic thin film transistor was prepared according to the same procedure as in Example 1, except that the following element preparation method 2 was performed instead of the element preparation method 1 described above. Furthermore, according to the same procedure as in Example 1, various evaluations were performed. The results are summarized in Table 2.

(Preparation of Organic Thin Film Transistor (Element Preparation Method 2))

Al which will become a gate electrode was vapor-deposited (film thickness: 50 nm) onto a glass substrate (Eagle XG: manufactured by Corning Incorporated). The Al layer was spin-coated with a composition for a gate insulating film (a PGMEA solution (solution concentration: 2% by mass) of polyvinylphenol/melamine=1 part by mass/1 part by mass (w/w)), and the composition was baked for 60 minutes at a temperature of 150° C., thereby forming an insulating film having a film thickness of 400 nm. The insulating film was spin-coated with the prepared composition 1, and the composition 1 was baked for 15 minutes at a temperature of 140° C., thereby forming an organic semiconductor layer having a film thickness of 100 nm. Thereafter, Ag was vapor-deposited onto the organic semiconductor layer through a mask, thereby forming a source electrode and a drain electrode having a channel length of 25 μm and a channel width of 180 μm. The source and drain electrodes were spin-coated with Cytop CTL-107MK (manufactured by ASAHI GLASS CO., LTD.), and Cytop CTL-107MK was baked for 20 minutes at a temperature of 140° C., thereby forming a sealing layer having a film thickness of 2 μm. In this way, an organic thin film transistor (top contact-type) was prepared. The present preparation method was named an element preparation method 2.

Examples 3 to 12 and Comparative Examples 1 to 7

Each of the compositions according to Examples 3 to 12 and Comparative Examples 1 to 7 was prepared by the same method as the preparation method of the composition 1, except that the type and mixing ratio of the organic semiconductor material and the migration inhibitor were changed as shown in Tables 2 and 3.

By using each of the compositions according to Examples 3 to 12 and Comparative Examples 1 to 7, an organic thin film transistor was prepared according to the element preparation method 1 or the element preparation method 2 as shown in Tables 2 and 3, and various evaluations were performed. The results are summarized in Tables 2 and 3.

At the time of performing the evaluation, as the organic semiconductor material in the comparative composition, a-1 was used in Examples 1 to 3, a-2 was used in Examples 4 to 10, a-3 was used in Example 11, a-4 was used in Example 12, a-1 was used in Comparative Examples 1 and 2, a-2 was used in Comparative Examples 3 and 4, a-3 was used in Comparative Example 5, and a-1 was used in Comparative Examples 6 and 7.

TABLE 2

| | | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|---|
| Composition for organic semiconductor | | Composition 1 | Composition 2 | Composition 3 | Composition 4 | Composition 5 | Composition 6 | Composition 7 | Composition 8 | Composition 9 | Composition 10 | Composition 11 | Composition 12 |
| Organic semiconductor material | | a-1 | a-1 | a-1 | a-2 | a-2 | a-2 | a-2 | a-2 | a-2 | a-2 | a-3 | a-4 |
| Migration inhibitor | | b-1 | b-1 | b-2 | b-5 | b-6 | b-7 | b-8 | b-9 | b-7 | b-7 | b-1 | b-7 |
| Amount of added migration inhibitor with respect to 100 parts by mass of organic semiconductor material (part by mass) | | 50 | 50 | 50 | 50 | 50 | 50 | 50 | 50 | 30 | 500 | 50 | 50 |
| Element preparation method | | 1 | 2 | 1 | 1 | 1 | 1 | 1 | 1 | 1 | 1 | 1 | 1 |
| Evaluation result | Mobility | B | B | A | A | A | A | B | A | A | B | B | A |
| | Insulation reliability | A | A | B | B | B | A | A | A | A | A | B | B |

TABLE 3

| | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Composition for organic semiconductor | Composition X1 | Composition X2 | Composition X3 | Composition X4 | Composition X5 | Composition X6 | Composition X7 |
| Organic semiconductor material | a-1 | a-1 | a-2 | a-2 | a-3 | a-1 | a-1 |
| Migration inhibitor | b-10 | b-11 | b-11 | b-12 | b-13 | b-3 | b-4 |
| Amount of added migration inhibitor with respect to 100 parts by mass of organic semiconductor material (part by mass) | 50 | 50 | 50 | 50 | 50 | 20 | 600 |
| Element preparation method | 1 | 2 | 1 | 1 | 1 | 1 | 1 |
| Evaluation result  Mobility | D | D | C | C | D | D | D |
| Evaluation result  Insulation reliability | C | C | C | C | C | D | D |

As shown in Table 2, in a case where the organic semiconductor composition of the present invention was used, the mobility and the insulation reliability of the organic thin film transistor prepared using the composition were excellent.

Particularly, as is evident from the comparison between the evaluation results of Example 6 and Example 12, in a case (Example 6) where a low-molecular weight organic semiconductor material was used, the effect of the insulation reliability was more markedly exhibited than in a case (Example 12) where a high-molecular weight organic semiconductor material was used.

In contrast, because none of the migration inhibitors contained in the compositions of Comparative Examples 1 to 5 corresponded to the aforementioned compounds (I) to (IV), the mobility and the insulation reliability of the organic thin film transistors prepared using the compositions were found to be insufficient.

The migration inhibitor contained in the composition of Comparative Example 6 did not correspond to the aforementioned compounds (I) to (III), and the content of the migration inhibitor was less than 30% by mass. Therefore, the mobility and the insulation reliability of the organic thin film transistor prepared using the composition was found to be insufficient.

The migration inhibitor contained in the composition of Comparative Example 7 did not correspond to the aforementioned compounds (I) to (III), and the content of the migration inhibitor was greater than 500% by mass. Therefore, the mobility and the insulation reliability of the organic thin film transistor prepared using the composition was found to be insufficient.

EXPLANATION OF REFERENCES

10: substrate
20: gate electrode
30: gate insulating film
40: source electrode
42: drain electrode
50: organic semiconductor layer
60: sealing layer
100, 200: organic thin film transistor

What is claimed is:
1. An organic semiconductor composition comprising:
an organic semiconductor material; and
at least one kind of migration inhibitor selected from a compound represented by the following Formula (I), a compound represented by the following Formula (II), and a compound represented by the following Formula (III),

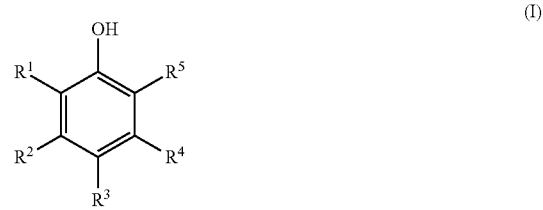

in Formula (I), $R^1$ to $R^5$ each independently represent a hydrogen atom or a substituent; at least one of $R^1$ or $R^5$ is —OH, —OR$^{26}$, —SR$^{27}$, —NHCOR$^{28}$, or —NHSO$_2$R$^{29}$, or $R^3$ is —SR$^{27}$, —NHCOR$^{28}$, or —NHSO$_2$R$^{29}$; and $R^{26}$ to $R^{29}$ each independently represent an alkyl group or an aryl group,

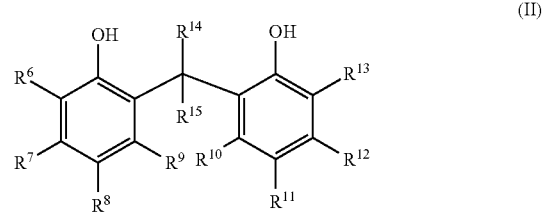

in Formula (II), $R^6$ to $R^{13}$ represent a hydrogen atom or a substituent; at least one of $R^6$, $R^7$, $R^8$, $R^9$, $R^{10}$, $R^{11}$, $R^{12}$, or $R^{13}$ is —OH, —OR$^{26}$, —SR$^{27}$, —NHCOR$^{28}$, or —NHSO$_2$R$^{29}$; $R^{26}$ to $R^{29}$ each independently represent an alkyl group or an aryl group; $R^{14}$ and $R^{15}$ each independently represent a hydrogen atom, an aliphatic group, an aromatic group, a heterocyclic group, —OH, —OR$^{30}$, —SR$^{31}$, or —NR$^{32}$R$^{33}$; $R^{30}$ to $R^{33}$ each independently represent an alkyl group or an aryl group; there is no case where both of $R^{14}$ and $R^{15}$ simultaneously represent a group selected from —OH, —OR$^{30}$, —SR$^{31}$, and —NR$^{32}$R$^{33}$; and $R^{14}$ and $R^{15}$ may form a ring by being bonded to each other, and

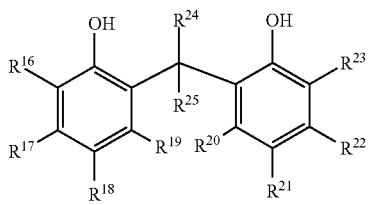

(III)

in Formula (III), $R^{16}$ to $R^{23}$ each independently represent a hydrogen atom, an aliphatic group, or an aromatic group; $R^{24}$ and $R^{25}$ each independently represent a hydrogen atom, an aliphatic group, an aromatic group, or a heterocyclic group; there is no case where both of $R^{24}$ and $R^{25}$ simultaneously represent a hydrogen atom; and $R^{24}$ and $R^{25}$ may form a ring by being bonded to each other.

2. An organic semiconductor composition comprising:
an organic semiconductor material; and
at least one kind of migration inhibitor selected from a compound represented by the following Formula (IV), a compound represented by the following Formula (II), and a compound represented by the following Formula (III),
wherein a content of the migration inhibitor is equal to or greater than 30% by mass and equal to or less than 500% by mass with respect to 100% by mass of the organic semiconductor material,

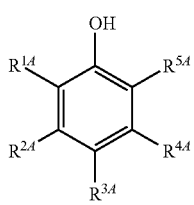

(IV)

in Formula (IV), $R^{1A}$ to $R^{5A}$ each independently represent a hydrogen atom or a substituent; at least one of $R^{1A}$, $R^{2A}$, $R^{3A}$, $R^{4A}$, or $R^{5A}$ is —OH, —OR$^{26}$, —SR$^{27}$, —NHCOR$^{28}$, or —NHSO$_2$R$^{29}$; and $R^{26}$ to $R^{29}$ each independently represent an alkyl group or an aryl group,

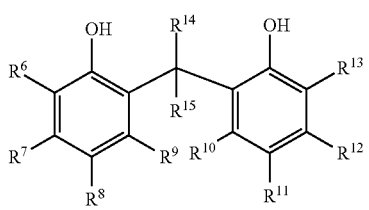

(II)

in Formula (II), $R^6$ to $R^{13}$ represent a hydrogen atom or a substituent; at least one of $R^6$, $R^7$, $R^8$, $R^9$, $R^{10}$, $R^{11}$, $R^{12}$, or $R^{13}$ is —OH, —OR$^{26}$, —SR$^{27}$, —NHCOR$^{28}$, or —NHSO$_2$R$^{29}$; $R^{26}$ to $R^{29}$ each independently represent an alkyl group or an aryl group; $R^{14}$ and $R^{15}$ each independently represent a hydrogen atom, an aliphatic group, an aromatic group, a heterocyclic group, —OH, —OR$^{30}$, —SR$^{31}$, or —NR$^{32}$R$^{33}$; $R^{30}$ to $R^{33}$ each independently represent an alkyl group or an aryl group; there is no case where both of $R^{14}$ and $R^{15}$ simultaneously represent a group selected from —OH, —OR$^{30}$, —SR$^{31}$, and —NR$^{32}$R$^{33}$; and $R^{14}$ and $R^{15}$ may form a ring by being bonded to each other, and

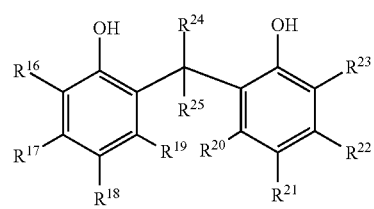

(III)

in Formula (III), $R^{16}$ to $R^{23}$ each independently represent a hydrogen atom, an aliphatic group, or an aromatic group; $R^{24}$ and $R^{25}$ each independently represent a hydrogen atom, an aliphatic group, an aromatic group, or a heterocyclic group; there is no case where both of $R^{24}$ and $R^{25}$ simultaneously represent a hydrogen atom; and $R^{24}$ and $R^{25}$ may form a ring by being bonded to each other.

3. The organic semiconductor composition according to claim 1,
wherein a chemical structure of the organic semiconductor material does not have a repeating unit.

4. An organic thin film transistor comprising:
an organic semiconductor layer prepared using the organic semiconductor composition according to claim 1.

5. The organic thin film transistor according to claim 4, further comprising:
a source electrode;
a drain electrode; and
a gate electrode,
wherein at least one of the source electrode, the drain electrode, and the gate electrode is made of a silver-containing material.

6. Electronic paper comprising:
the organic thin film transistor according to claim 4.

7. A display device comprising:
the organic thin film transistor according to claim 4.

8. The organic semiconductor composition according to claim 2,
wherein a chemical structure of the organic semiconductor material does not have a repeating unit.

9. An organic thin film transistor comprising:
an organic semiconductor layer prepared using the organic semiconductor composition according to claim 2.

10. An organic thin film transistor comprising:
an organic semiconductor layer prepared using the organic semiconductor composition according to claim 3.

11. An organic thin film transistor comprising:
an organic semiconductor layer prepared using the organic semiconductor composition according to claim 8.

12. The organic thin film transistor according to claim 9, further comprising:
a source electrode;
a drain electrode; and
a gate electrode, wherein at least one of the source electrode, the drain electrode, and the gate electrode is made of a silver-containing material.

13. The organic thin film transistor according to claim 10, further comprising:
   a source electrode;
   a drain electrode; and
   a gate electrode,
   wherein at least one of the source electrode, the drain electrode, and the gate electrode is made of a silver-containing material.

14. The organic thin film transistor according to claim 11, further comprising:
   a source electrode;
   a drain electrode; and
   a gate electrode,
   wherein at least one of the source electrode, the drain electrode, and the gate electrode is made of a silver-containing material.

15. An electronic paper comprising:
   the organic thin film transistor according to claim 5.

16. An electronic paper comprising:
   the organic thin film transistor according to claim 9.

17. An electronic paper comprising:
   the organic thin film transistor according to claim 10.

18. An electronic paper comprising:
   the organic thin film transistor according to claim 11.

19. A display device comprising:
   the organic thin film transistor according to claim 5.

20. A display device comprising:
   the organic thin film transistor according to claim 9.

* * * * *